United States Patent
Murakami et al.

(10) Patent No.: US 8,448,040 B2
(45) Date of Patent: May 21, 2013

(54) DECODING METHOD AND DECODING APPARATUS

(75) Inventors: Yutaka Murakami, Osaka (JP); Shutai Okamura, Osaka (JP); Masayuki Orihashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/599,905

(22) Filed: Aug. 30, 2012

(65) Prior Publication Data

US 2012/0324309 A1    Dec. 20, 2012

Related U.S. Application Data

(63) Continuation of application No. 12/674,898, filed as application No. PCT/JP2008/002367 on Aug. 29, 2008, now Pat. No. 8,286,050.

(30) Foreign Application Priority Data

Aug. 31, 2007  (JP) .................................. 2007-226822

(51) Int. Cl.
    *H03M 13/00*     (2006.01)
(52) U.S. Cl.
    USPC ............ 714/752; 714/794; 714/795; 714/796
(58) Field of Classification Search .................. 714/752, 714/794–796
    See application file for complete search history.

(56) References Cited

U.S. PATENT DOCUMENTS

| 7,143,333 | B2 |   | 11/2006 | Blankenship |   |
|-----------|----|---|---------|-------------|---|
| 7,222,289 | B2 | * | 5/2007  | Hung ............................ | 714/807 |
| 7,343,539 | B2 | * | 3/2008  | Divsalar et al. ............... | 714/755 |
| 7,499,490 | B2 | * | 3/2009  | Divsalar et al. ............... | 375/240 |
| 7,500,172 | B2 | * | 3/2009  | Shen et al. ..................... | 714/780 |
| 7,757,150 | B2 |   | 7/2010  | Stolpman |   |
| 7,853,862 | B2 | * | 12/2010 | Lakkis ......................... | 714/800 |
| 8,214,717 | B2 | * | 7/2012  | Oh et al. ....................... | 714/759 |
| 2006/0294445 | A1 |   | 12/2006 | Divsalar |   |

FOREIGN PATENT DOCUMENTS

| JP | 2007-43635   | 2/2007 |
| WO | 2006/020205  | 2/2006 |
| WO | 2006-059688  | 6/2006 |

OTHER PUBLICATIONS

Japanese Office Action dated May 15, 2012.
Bäro, S., et al., "Iterative Detection of MIMO Transmission Using a List-Sequential (LISS) Detector," 2003 IEEE International Conference on Communications 4:2653-2657, May 2003.

(Continued)

*Primary Examiner* — Esaw Abraham
(74) *Attorney, Agent, or Firm* — Dickinson Wright PLLC

(57) ABSTRACT

A decoding device allowing a high-speed decoding operation. In a decoding section (215), if a degree of a check equation by a check matrix is D and the relationship between the check equation of the j+first row of the check matrix and the cheek equation of the jth row is shifted by n-bit, row processing operation sections (405#1 to 405#3) and column processing operation sections (410#1 to 410#3) perform the operation of a protograph in which the columns of the check matrix are delimited for each "(D+1)×N (N: natural number)," and the rows of the check matrix are delimited for each "(D+1)×N/n," and formed as the processing unit of the row processing operation and column processing operation.

6 Claims, 21 Drawing Sheets

OTHER PUBLICATIONS

Chen, J., et al., "Reduced-Complexity Decoding of LDPC Codes," IEEE Transactions on Communications 53(8): 1288-1299, Aug. 2005.

Felström, A.J., and K.S. Zigangirov, "Time-Varying Periodic Convolutional Codes with Low-Density Parity-Check Matrix," IEEE Transactions on Information Theory 45(6): 2181-2191, Sep. 1999.

Fossorier, M.P.C, et al., "Reduced Complexity Iterative Decoding of Low-Density Parity Check Codes Based on Belief Propagation," IEEE Transactions on Communications 47(5): 673-680, May 1999.

Gallager, R.G., "Low-Density Parity-Check Codes," IRE Transactions on Information Theory, M.I.T. Press, Cambridge, Massachusetts, Jan. 1963, pp, 21-28.

Hocevar, D., "A Reduced Complexity Decoder Architecture via Layered Decoding of LDPC Codes," IEEE Workshop on Signal Processing Systems (SIPS 2004), Oct. 2004, pp. 107-112.

Hochwald, B.M. And S.T. Brink, "Achieving Near-Capacity on a Multiple-Antenna Channel," IEEE Transactions on Communications 51(3): 389-399, Mar. 2003.

International Search Report, mailed Oct. 7,2008, issued in corresponding International Application No. PCT/JP2008/002367, filed Aug. 29,2008.

Liu, Y., et al., "A Feedback Belief Propagation Algorithm for LDPC Convolutional Codes," Proceedings of IEEE International Symposium on Information Theory, Toronto, Jul. 6-11, 2008, pp. 151-155.

Lu, B., et al., "Performance Analysis and Design Optimization of LDPC-Coded MIMO OFDM Systems," IEEE Transactions on Signal Processing 52(2): 348-361, Feb. 2004.

Richter, G., et al., "Irregular Low-Density Parity-Check Convolutional Codes Based on Protographs," Proceedings of IEEE International Symposium on Information Theory, Seattle, Wa., Jul. 9-14, 2006, pp. 1633-1637.

Zhang, J. And M.P.C. Fossorier, "Shuffled Iterative Decoding," IEEE Transactions on Communications 53(2): 209-213, Feb. 2005.

Zhou, X.S., et al., "Quantitative Evaluation of Low Density Parity Check Convolutional Code Encoder and Decoder Algorithms for the XlnC MIMD Mulithreaded Microprocessor," Proceedings of the Canadian Conference on Electrical and Computer Engineering, Vancouver, B.C., Apr. 22-26,2007, pp. 1361-1365.

Extended European Search Report dated Oct. 7, 2010.

A. Sridharan, "Design and Analysis of LDPC Convolutional Codes: A Dissertation," Feb. 2005, 170 pp. total, including: 3 unnumbered pages, pp. i-xi and 1-156.

Z. Chen, et al., "Low-Density Parity-Check Convolutional Codes Applied to Packet Based Communication Systems," IEEE Globecom 2005, pp. 1250-1254.

* cited by examiner $$\mathbf{H}^T_{[0,n]} = \begin{pmatrix} h_1^{(0)}(0) & h_1^{(1)}(1) & \cdots & h_1^{(M)}(M) & 0 & 0 & \cdots & 0 \\ h_2^{(0)}(0) & h_2^{(1)}(1) & \cdots & h_2^{(0)}(M) & h_1^{(M)}(M+1) & 0 & \cdots & 0 \\ 0 & h_1^{(0)}(1) & \cdots & \vdots & h_2^{(M)}(M+1) & \ddots & & \vdots \\ 0 & h_2^{(0)}(1) & \cdots & \vdots & \vdots & \ddots & & h_1^{(M)}(n) \\ \vdots & 0 & & \vdots & \vdots & & & h_2^{(M)}(n) \\ & & & & & & \cdots & \vdots \\ & & & & & & & h_2^{(0)}(n) \end{pmatrix}$$

DECODING METHOD AND DECODING APPARATUS

This is a continuation application of application Ser. No. 12/674,898 filed Feb. 23, 2010, which is a national stage of PCT/JP2008/002367 filed Aug. 29, 2008, which is based on Japanese Application No. 2007-226822 filed Aug. 31, 2007, the entire contents of each of which are incorporated by reference herein.

TECHNICAL FIELD

The present invention relates to a decoding method, decoding apparatus, interleaving method and transmitting apparatus for LDPC-CC (Low-Density Parity-Check Convolutional Code) or convolutional code.

BACKGROUND ART

Recently, as an error correction code to realize high error correction performance in a feasible circuit scale, an LDPC (Low-Density Parity-Check) code attracts attentions. An LDPC code provides high error correction performance and can be implemented in a simple manner, and is therefore adopted for error correction coding schemes in the fast wireless LAN system of IEEE802.11n and a digital broadcast system.

An LDPC code is an error correction code defined by a low-density parity check matrix H. Further, an LDPC code is a block code having the same length as the number of columns N of check matrix H.

However, like Ethernet (trademark), most of today's communication systems have a feature of grouping and communicating transmission information on a per variable-length packet basis or on a per frame basis. If an LDPC code, which is a block code, is applied to such systems, for example, a problem arises as to how a fixed-length LDPC code block is applied to a variable-length Ethernet (trademark) frame. In IEEE802.11n, although padding process and puncturing process are applied to a transmission information sequence to adjust the transmission information sequence length and the LDPC code block length, it is not possible to prevent a change of the coding rate and a redundant sequence transmission by padding and puncturing.

As such an LDPC code of a block code (hereinafter referred to as "LDPC-BC" (Low-Density Parity-Check Block Code)), an LDPC-CC (Low-Density Parity-Check Convolutional Code), which can encode and decode an information sequence of an arbitrary length, is studied (e.g. see Non-Patent Document 1 and Non-Patent Document 2).

An LDPC-CC is a convolutional code defined by a low-density parity check matrix, and, for example, FIG. 1 shows a parity check matrix $H^T[0, n]$ of an LDPC-CC of coding rate R=1/2 (=b/c).

Here, elements $h_1^{(m)}(t)$ and $h_2^{(m)}(t)$ of $H^T[0, n]$ have "0" or "1."

Also, all the other elements than $h_1^{(m)}(t)$ and $h_2^{(m)}(t)$ included in $H^T[0, n]$ have "0." M represents the memory length in the LDPC-CC, and n represents the codeword length of the LDPC-CC. As shown in FIG. 1, an LDPC-CC check matrix has a feature of a parallelogram shape, in which "1's" are assigned only to the diagonal elements and their nearby elements of the matrix and "0's" are assigned to the lower left elements and upper right elements of the matrix.

Here, referring to an example of coding rate R=1/2 (=b/c), in the case of $h1^{(0)}(t)=1$ and $h2^{(0)}(t)=1$, LDPC-CC coding is performed by implementing the following equation according to check matrix $H^T[0, n]$.

(Equation 1)

$$v_{1,n} = u_n \quad [1]$$
$$v_{2,n} = \sum_{i=0}^{M} h_1^{(i)}(n) u_{n-i} + \sum_{i=1}^{M} h_2^{(i)}(n) v_{2,n-i}$$

Here, $u_n$ represents the transmission information sequence, and $v_{1,n}$ and $v_{2,n}$ represent the transmission codeword sequences.

FIG. 2 shows an example of an LDPC-CC encoder that implements equation 1.

As shown in FIG. 2, LDPC-CC encoder 10 is formed with shift registers 11-1 to 11-M and 14-1 to 14-M, weight multipliers 12-0 to 12-M and 13-0 to 13-M, weight control section 17, mod 2 adder 15 and bit counter 16.

Shift registers 11-1 to 11-M and shift registers 14-1 to 14-M hold $v_{1,n-i}$ and $v_{2,n-i}$ (i=0, . . . , M), respectively, transmit the held values to the right neighboring shift registers at the timing the next inputs are entered, and hold the values transmitted from the left neighboring shift registers.

Weight multipliers 12-0 to 12-M and 13-0 to 13-M switch the values of $h_1^{(m)}$ and $h_2^{(m)}$ between 0 and 1, according to control signals transmitted from weight control section 17.

Weight control section 17 transmits the values of $h_1^{(m)}$ and $h_2^{(m)}$ at the timing to weight multipliers 12-0 to 12-M and 13-0 to 13-M, based on the count number transmitted from bit counter 16 and a check matrix held in weight control section 17. By performing mod 2 addition process for the outputs of weight multipliers 12-0 to 12-M and 13-0 to 13-M, mod 2 adder 15 calculates $v_{2,n-i}$. Bit counter 16 counts the number of bits of transmission information sequence $u_n$ received as input.

By employing such a configuration, LDPC-CC encoder 10 can perform LDPC-CC coding according to a check matrix.

An LDPC-CC encoder has a feature that this encoder can be realized with a very simple circuit, compared to a circuit that performs multiplication with a generation matrix and an LDPC-BC encoder that performs calculations based on the backward (forward) substitution method. Also, an LDPC-CC encoder is the encoder for convolutional codes, so that it is not necessary to separate a transmission information sequence into blocks of a fixed length and encode the results, and it is possible to encode an information sequence of an arbitrary length.

By the way, it is possible to apply the sum-product algorithm to LDPC-CC decoding. Therefore, it is not necessary to use decoding algorithms for performing maximum likelihood sequence estimation such as the BCJR algorithm and the Viterbi algorithm, so that it is possible to finish decoding process with low process delay. Further, a pipeline-type decoding algorithm is proposed utilizing the form of a parallelogram-shaped check matrix in which "1's" are assigned (e.g. see Non-Patent Document 1).

It is shown that, if LDPC-CC decoding performance and LDPC-BC decoding performance are compared using parameters by which the circuit scales of decoders are equal, LDPC-CC decoding performance is superior.

By the way, there is a demand to reduce the calculation scale by decreasing the number of iterations of iterative decoding in sum-product decoding. Up till now, as a technique for making the number of iterations smaller than in sum-product decoding, the shuffled BP (Belief-Propagation)

decoding disclosed in Non-Patent Document 3 and the layered BP decoding disclosed in Non-Patent Document 4 are proposed.

Non-Patent Document 1: A. J. Felstorom, and K. Sh. Zigangirov, "Time-Varying Periodic Convolutional Codes With Low-Density Parity-Check Matrix," IEEE Transactions on Information Theory, Vol. 45, No. 6, pp 2181-2191, September 1999

Non-Patent Document 2: G. Richter, M. Kaupper, and K. Sh. Zigangirov, "Irregular low-density parity-Check convolutional codes based on protographs," Proceeding of IEEE ISIT 2006, pp 1633-1637

Non-Patent Document 3: J. Zhang, and M. P. C. Fossorier, "Shuffled iterative decoding," IEEE Trans. Commun., vol. 53, no. 2, pp. 209-213, February 2005

Non-Patent Document 4: D. Hocevar, "A reduced complexity decoder architecture via layered decoding of LDPC codes," in Signal Processing Systems SIPS 2004. IEEE Workshop on, pp. 107-112, October 2004

Non-Patent Document 5: B. Lu, G. Yue, and X. Wang, "Performance analysis and design optimization of LDPC-coded MIMO OFDM systems," IEEE Trans. Signal Processing., vol. 52, no. 2, pp. 348-361, February 2004

Non-Patent Document 6: B. M. Hochwald, and S. ten Brink, "Achieving near-capacity on a multiple-antenna channel" IEEE Trans. Commun., vol. 51, no. 3, pp. 389-399, March 2003.

Non-Patent Document 7: S. Baro, J. Hagenauer, and M. Wizke, "Iterative detection of MIMO transmission using a list-sequential (LISS) detector" Proceeding of IEEE ICC 2003, pp 2653-2657.

Non-Patent Document 8: S. Lin, D. J. Jr., Costello, "Error control coding: Fundamentals and applications," Prentice-Hall.

Non-Patent Document 9: R. D. Gallager, "Low-Density Parity-Check Codes," Cambridge, Mass.: MIT Press, 1963.

Non-Patent Document 10: M. P. C. Fossorier, M. Mihaljevic, and H. Imai, "Reduced complexity iterative decoding of low density parity check codes based on belief propagation," IEEE Trans. Commun., vol. 47, no. 5, pp. 673-680, May 1999.

Non-Patent Document 11: J. Chen, A. Dholakia, E. Eleftheriou, M. P. C. Fossorier, and X.-Yu Hu, "Reduced-complexity decoding of LDPC codes," IEEE Trans. Commun., vol. 53., no. 8, pp. 1288-1299, August 2005.

DISCLOSURE OF INVENTION

Problems to be Solved by the Invention

By the way, to further improve communication speed, it is necessary to provide a decoding apparatus that further reduces the calculation scale by making the number of iterations of iterative decoding smaller than in the above shuffled BP decoding and layered BP decoding, and that enables faster operations. Up till now, especially, methods for reducing the number of iterations efficiently and improving process delay in LDPC-CC are not considered sufficiently.

It is therefore an object of the present invention to provide a decoding method, decoding apparatus, interleaving method and transmitting apparatus for LDPC-CC or convolutional code for enabling fast decoding operations.

Means for Solving the Problem

An aspect of the decoding method of the present invention includes: a calculating step of performing a row process calculation and column process calculation using a check matrix; and an estimating step of estimating a codeword using a calculation result in the calculating step, where, when the degree of a check equation by the check matrix is D and a check equation of the (j+1)-th row and a check equation of the j-th row in the check matrix are shifted by n bits from each other, the calculating step performs calculations using, as a process unit of the row process calculation and the column process calculation, protographs formed by separating columns of the check matrix per (D+1)×N (natural number) and separating rows of cheek matrix per (D+1)×N/n.

An aspect of the decoding method of the present invention includes: a calculating step of performing a row process calculation and column process calculation using a check matrix; and an estimating step of estimating a codeword using a calculation result in the calculating step, where, the calculating step performs calculations using, as a process unit of the row process calculation and the column process calculation, a plurality of blocks formed by separating columns of the check matrix per the number of columns of a protograph forming the check matrix×N (natural number) and separating rows of the check matrix per the number of rows of the protograph×M (natural number).

An aspect of the decoding apparatus of the present invention employs a configuration having: a row process calculating section that performs a row process calculation using a check matrix; a column process calculating section that performs a column process calculation using the check matrix; and a deciding section that estimates a codeword using calculation results in the row process calculating section and the column process calculating section, where, when the degree of a check equation by the check matrix is D and a check equation of the (j+1)-th row and a check equation of the j-th row in the check matrix are shifted by n bits from each other, the row process calculating section and the column process calculating section perform calculations using, as a process unit of the row process calculation and the column process calculation, protographs formed by separating columns of the check matrix per (D+1)×N (natural number) and separating rows of check matrix per (D+1)×N/n.

An aspect of the decoding apparatus of the present invention employs a configuration having: a row process calculating section that performs a row process calculation using a check matrix; a column process calculating section that performs a column process calculation using the check matrix; and a deciding section that estimates a codeword using calculation results in the row process calculating section and the column process calculating section, where the row process calculating section and the column process calculating section perform calculations using, as a process unit of the row process calculation and the column process calculation, a plurality of blocks formed by separating columns of the check matrix per the number of columns of a protograph forming the check matrix×N (natural number) and separating rows of the check matrix per the number of rows of the protograph×M (natural number).

An embodiment of the interleaving method of the present invention is that, when the degree of a check equation by a cheek matrix is D and a check equation of the (j+1)-th row and a check equation of the j-th row in the check matrix are shifted by n bits from each other, the interleaving section divides a data period in one frame into two or more blocks, forms data of one block with (D+1)×N (natural number) bits and applies interleaving in the block.

An aspect of the interleaving method of the present invention is to divide a data period in one frame into two or more blocks, form data of one block with "the number of columns of a protograph dividing a check matrix for row process calculation and column process calculation×N (natural number)" bits, and apply interleaving in the block.

An aspect of the transmitting apparatus of the present invention employs a configuration having: an encoding section that performs LDPC-CC coding; and an interleaving section that interleaves encoded data acquired in the encoding section, where, when the degree of a check equation by a check matrix is D and a check equation of the (j+1)-th row and a check equation of the j-th row in the check matrix are shifted by n bits from each other, the interleaving section divides a data period in one frame into two or more blocks, forms data of one block with (D+1)×N (natural number) bits and applies interleaving in the block.

An aspect of the transmitting apparatus of the present invention employs a configuration having: an encoding section that performs LDPC-CC coding; and an interleaving section that interleaves encoded data acquired in the encoding section, where the interleaving section divides a data period in one frame into two or more blocks, forms data of one block with "the number of columns of a protograph dividing a check matrix for row process calculation and column process calculation×N (natural number)" bits, and applies interleaving in the block.

Advantageous Effects of Invention

According to the present invention, it is possible to realize a decoding method, decoding apparatus, interleaving method and transmitting apparatus for LDPC-CC or convolutional code for enabling fast decoding operations.

BRIEF DESCRIPTION OF DRAWINGS

FIG. 1 shows an LDPC-CC check matrix;
FIG. 3 shows an example of an LDPC-CC check matrix according to Embodiment 1;
FIG. 5 illustrates a protograph forming method according to Embodiment 1;
FIG. 6 illustrates the BP decoding steps according to Embodiment 1;
FIG. 7 illustrates the BP decoding steps according to Embodiment 1;
FIG. 20 shows an example of an LDPC-CC check matrix according to other embodiments;
and
FIG. 21 illustrates a protograph forming method according to other embodiments.

BEST MODE FOR CARRYING OUT THE INVENTION

Now, embodiments of the present invention will be described in detail with reference to the accompanying drawings.

Embodiment 1

(1) Decoding Algorithm (1-1) General LDPC-CC Decoding Algorithm

First, prior to explaining the decoding method of the present invention, a general LDPC-CC decoding algorithm will be explained.

Figure 3:
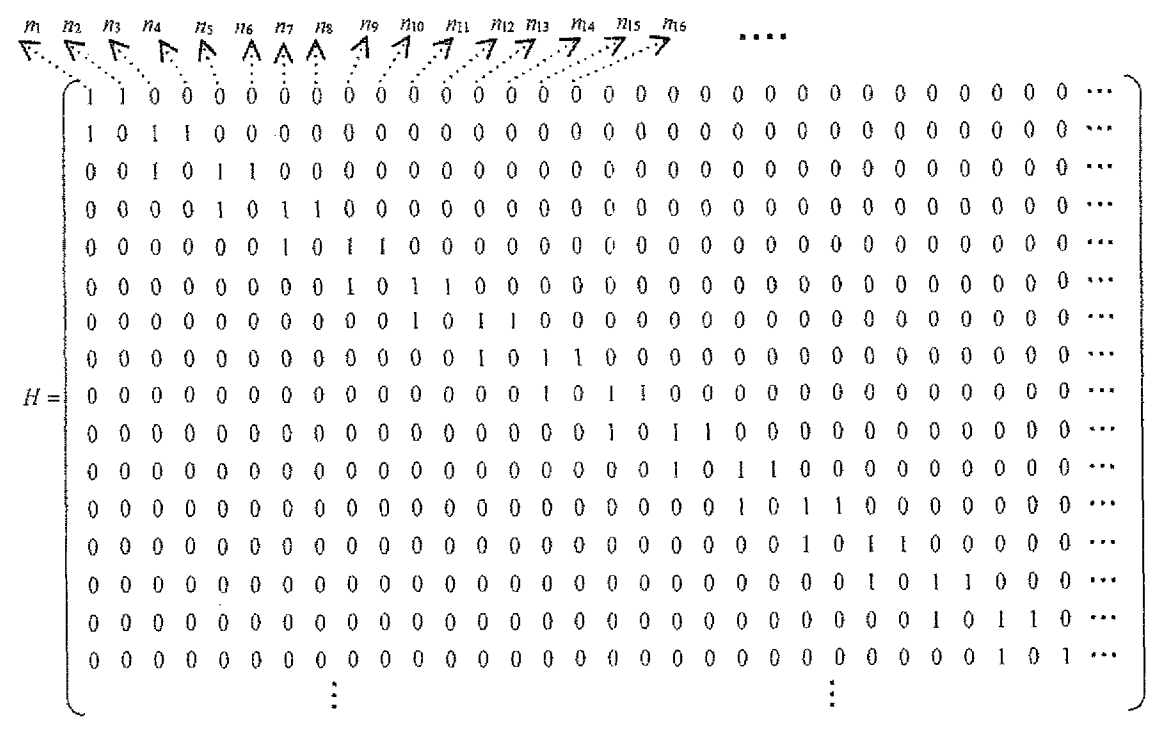

FIG. 3 shows an example of an LDPC-CC check matrix.

Here, the main flow of the sum-product decoding algorithm, which is a kind of BP (Belief-Propagation) decoding, is as follows.

Assume that two-dimensional (M×N) matrix $H=\{H_{mn}\}$ is the parity check matrix for an LDPC code of the decoding target. Subsets A(m) and B(n) of the set $[1,N]=\{1,2,\ldots,N\}$ are defined as the following equations.

$$A(m) \equiv \{n:H_{mn}=1\} \quad \text{(Equation 2)}$$

$$B(n) \equiv \{m:H_{mn}=1\} \quad \text{(Equation 3)}$$

Here, A(m) means the set of column indices of "1's" in the m-th row of parity check matrix H, and B(n) represents the set of row indices of "1's" in the n-th row of parity check matrix H.

Step A·1 (initialization): a log-likelihood ratio $\alpha^{(i)}_{mn}$ is set for all combinations (m, n) satisfying $H_{mn}=1$. Also, the loop variable (the number of iterations) $1_{sum}=1$ and the maximum number of loops is set as $1_{sum, max}$.

Step A·2 (row process): the log-likelihood ratio $\alpha^{(i)}_{mn}$ is updated with respect to all combinations (m, n) satisfying $H_{mn}=1$ in the order of m=1, 2, ... and M, using the following updating equations. Here, i represents the number of iterations. Also, f represents Gallager function.

(Equation 4)

$$\alpha^{(i)}_{mn} = \left( \prod_{n' \in A(m) \setminus n} \operatorname{sign}(\beta^{(i-1)}_{mn'}) \right) \times f\left( \sum_{n' \in A(m) \setminus n} f(|\beta^{(i-1)}_{mn'}|) \right) \quad [4]$$

(Equation 5)

$$\operatorname{sign}(x) \equiv \begin{cases} 1 & x \geq 0 \\ -1 & x < 0 \end{cases} \quad [5]$$

(Equation 6)

$$f(x) \equiv \ln \frac{\exp(x)+1}{\exp(x)-1} \quad [6]$$

Step A·3 (column process): the log-likelihood ratio $\beta^{(i)}_{mn}$ is updated with respect to all combinations (m, n) satisfying $H_{mn}=1$ in the order of n=1, 2, ... and N, using the following updating equation.

(Equation 7)

$$\beta^{(i)}_{mn} = \lambda_n + \sum_{m' \in B(n)\backslash m} \alpha^{(i)}_{m'n} \quad [7]$$

Step A·4 (calculation of a log-likelihood ratio): log-likelihood ratio $L^{(i)}_n$ is found with respect to $n \in [1, N]$ as in the following equation.

(Equation 8)

$$L^{(i)}_n = \lambda_n + \sum_{m' \in B(n)} \alpha^{(i)}_{m'n} \quad [8]$$

Step A·5 (count of the number of iterations): if $1_{sum} < 1_{sum,max}$, $1_{sum}$ is incremented, and the step returns to step A·2. If $1_{sum}=1_{sum,max}$, codeword w is estimated as shown in the following equation, and sum-product decoding is finished.

(Equation 9)

$$w \equiv \begin{cases} 0 & L^{(i)}_n \geq 0 \\ 1 & L^{(i)}_n < 0 \end{cases} \quad [9]$$

Figure 2:
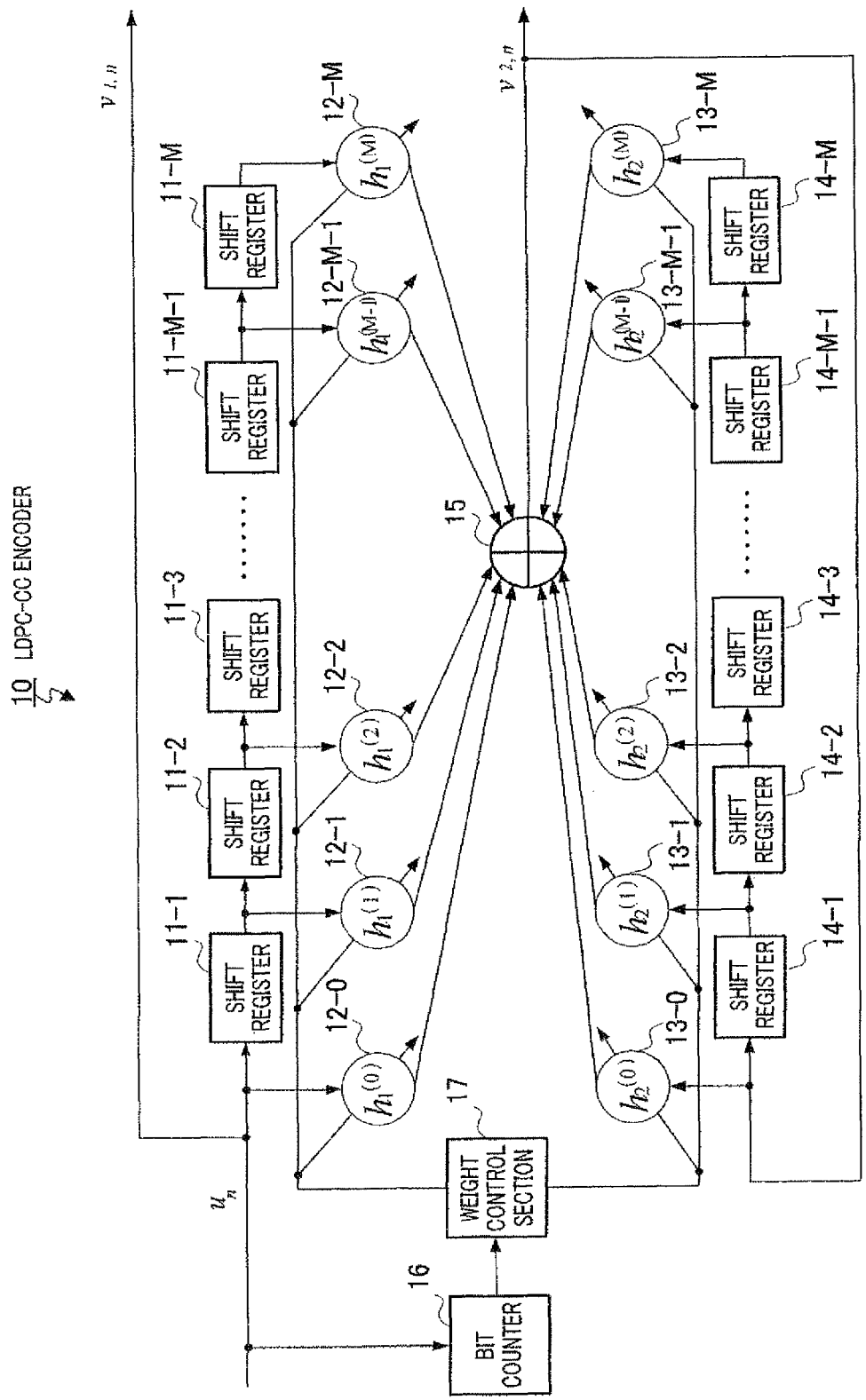
FIG. 2 shows a configuration example of an LDPC-CC encoder.
Figure 4:
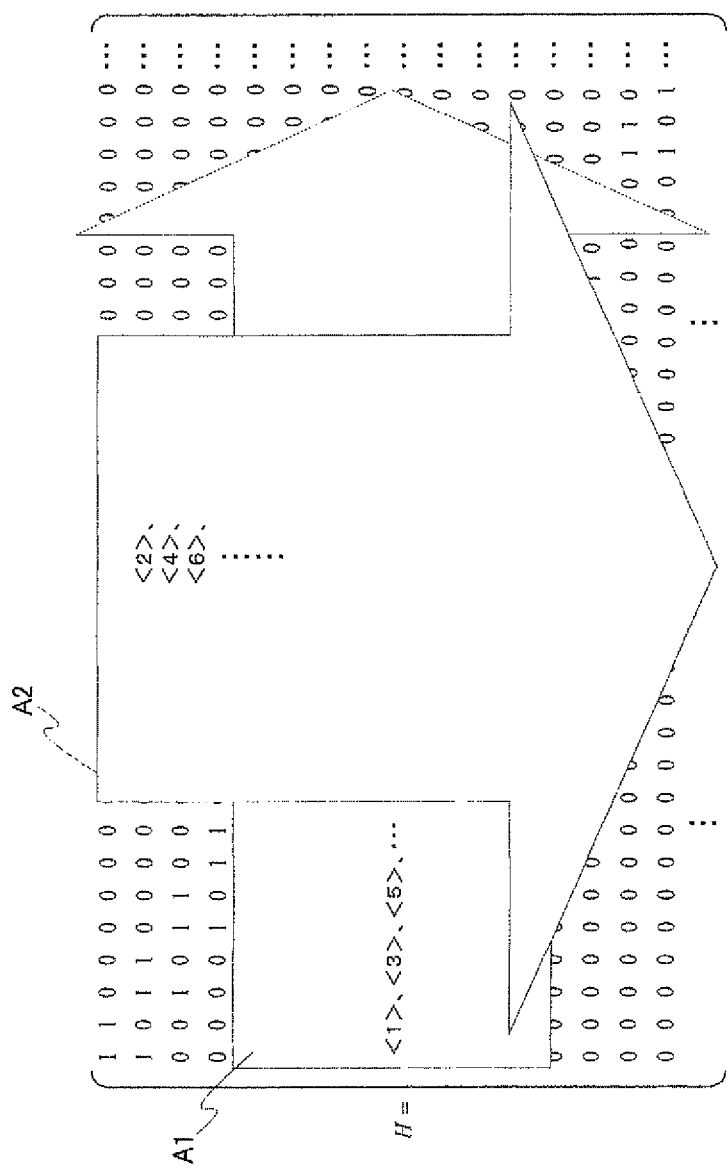
FIG. 4 shows the calculation steps with respect to check matrix H in sum-product decoding (BP decoding)

FIG. 4 shows the calculation steps with respect to check matrix H in sum-product decoding. In FIG. 4, arrow A1 shows an image of row process, and arrow A2 shows an image of column process. Sum-product decoding is performed in the following steps.

First, as shown in FIG. 4<1>, row process is applied to the positions where "1's" are present in check matrix H.

Next, as shown in FIG. 4<2>, column process is applied to the positions where "1's" are present in check matrix H. The above is the decoding calculation for the first iteration.

Next, by applying row process to the positions where "1's" are present in check matrix H as shown in FIG. 4<3> and then applying column process to the positions where "1's" are present in check matrix H as shown in FIG. 4<4>, the decoding calculation for the second iteration is performed.

Next, by applying row process to the positions where "1's" are present in check matrix H as shown in FIG. 4<5> and then applying column process to the positions where "1's" are present in check matrix H as shown in FIG. 4<6>, the decoding calculation for the third iteration is performed.

Subsequently, iterative decoding is repeated until desired received quality is acquired.

Next, the generation steps of LDPC codes will be explained briefly.

The following relational equation holds between check matrix H and generation matrix G.

$$HG^T = 0 \quad \text{(Equation 10)}$$

Also, when a transmission sequence (encoded data) is $n_1$, $n_2$, $n_3$, $n_4$, and so on, as shown in FIG. 3, and transmission sequence vector u is expressed by $(n_1, n_2, n_3, n_4 ...)$, transmission sequence vector u can be found using information sequence (i.e. data before coding) vector $i=(i_1, i_2, ...)$ and generation matrix G, as shown in the following equation.

$$u = iG \quad \text{(Equation 11)}$$

On the coding side, a transmission sequence is acquired utilizing the relational equations of equation 10 and equation 11. Also, in the case of LDPC-CC codes, as disclosed in Non-Patent Document 1 and Non-Patent Document 2, it is possible to realize coding with a relatively simple configuration using shift registers and exclusive OR circuit.

Here, in check matrix H, log-likelihood ratio $\lambda_n$ used upon sum-product decoding is arranged in the order of $n_1$, $n_2$, $n_3$, $n_4$, and so on, as shown in FIG. 3.

(1-2) Decoding Method of the Present Embodiment

By the way, as noted in Non-Patent Document 3 and Non-Patent Document 4, sum-product decoding has a disadvantage that the above number of iterations of iterative decoding needs to be set larger to acquire good received quality.

Therefore, the present embodiment proposes a decoding method that is suitable to LDPC-CC codes and that can acquire good received quality with a smaller number of iterations. The decoding method of the present embodiment is a variation of sum-product decoding.

Figure 5:
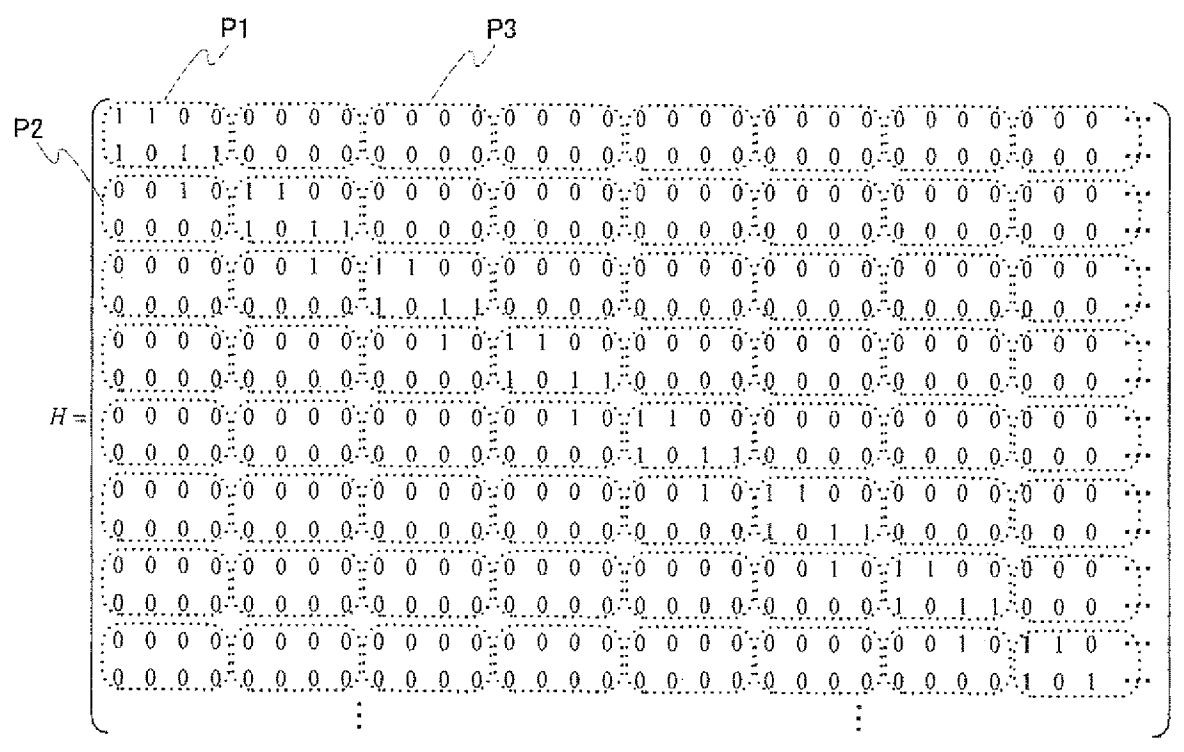

FIG. 5 shows an example of LDPC-CC check matrix H. When a transmission sequence (encoded data) is expressed as $n_k$, $n_{k-1}$, $n_{k-2}$, $n_{k-3}$ (where k is an even number), the following check equation holds from check matrix H.

$$n_k + n_{k-1} + n_{k-3} = 0 \quad \text{(Equation 12)}$$

Here, generation matrix G according to check matrix H in FIG. 5 can be expressed by the following polynomial.

$$G(d) = d^3 + d + 1 \quad \text{(Equation 13)}$$

Equation 12 and equation 13 are polynomials of the third degree.

With the present embodiment, when a check equation of check matrix H is expressed by a polynomial, the columns of check matrix H are separated per "the degree of the check equation+1." In the example of equation 12, the degree of the check matrix is three, and therefore check matrix H is separated per 4 (=3+1) columns. When this is expressed in a general form, with the present embodiment, the columns of check matrix H are separated per "(the degree of the check equation+1)×N."

Here, N is a natural number.

Also, the check equation of the (j+1)-th row and the check equation of the j-th row in LDPC-CC check matrix H are shifted by n bits from each other. That is, check equations of LDPC-CC check matrix H hold every time n bits are shifted in the column direction of check matrix H. Therefore, the present embodiment separates the rows of check matrix H per "(check matrix degree+1)×N/n." In the example of FIG. 5, the degree of the check equation is three and n is two, and therefore the rows of check matrix H are separated per 2 (=(3+1)× ½) (where N=1).

The dotted lines in FIG. 5 show a state where the rows and columns of the check matrix are separated in the above methods. As understood from FIG. 5, each protograph (i.e. regions surrounded by dotted lines in the figure) acquired by separating the rows and columns of check matrix H in the above methods belongs to one of three kinds of patterns. That is, check matrix H is formed by combining protographs of the pattern represented by reference code P1, protographs of the pattern represented by reference code P2 and protographs of the pattern represented by reference code P3 in the figure.

Next, using FIG. 6, the steps of BP (Belief-Propagation) decoding according to the present embodiment will be explained. Also, in FIG. 6, <1> to <18> show the order of process.

Process <1>: Row process is applied to the positions where "1's" are present in the protographs formed with the first to fourth columns and the first to fourth rows (i.e. the protograph formed with column region C1 and row region R1 and the protograph formed with column region C1 and row region R2).

Process <2>: Column process is applied to the positions where "1's" are present in the protographs formed with the first to fourth columns and the first to fourth rows (i.e. the protograph formed with column region C1 and row region R1 and the protograph formed with column region C1 and row region R2).

Process <3>: Row process is applied to the positions where "1's" are present in the protographs formed with the first to eighth columns and the third to fourth rows (i.e. the protograph formed with column region C1 and row region R2 and the protograph formed with column region C2 and row region R2). In addition, row process is applied to the positions where "1's" are present in the protograph formed with the fifth to eighth columns and the fifth to sixth rows (i.e. the protograph formed with column region C2 and row region R3).

Process <4>: Column process is applied to the positions where "1's" are present in the protographs formed with the first to fourth columns and the first to fourth rows (i.e. the protograph formed with column region C1 and row region R1 and the protograph formed with column region C1 and row region R2). In addition, column process is applied to the positions where "1's" are present in the protographs formed with the fifth to eighth columns and the third to sixth rows (i.e. the protograph formed with column region C2 and row region R2 and the protograph formed with column region C2 and row region R3).

Process <5>: Row process is applied to the positions where "1's" are present in the protographs formed with the fifth to twelfth columns and the fifth to sixth rows (i.e. the protograph formed with column region C2 and row region R3 and the protograph formed with column region C3 and row region R3). In addition, row process is applied to the positions where "1's" are present in the protograph formed with the ninth to twelfth columns and the seventh to eighth rows (i.e. the protograph formed with column region C3 and row region R4).

Process <6>: Column process is applied to the positions where "1's" are present in the protographs formed with the fifth to eighth columns and the third to sixth rows (i.e. the protograph formed with column region C2 and row region R2 and the protograph formed with column region C2 and row region R3). In addition, column process is applied to the positions where "1's" are present in the protographs formed with the ninth to twelfth columns and the fifth to eighth rows (i.e. the protograph formed with column region C3 and row region R3 and the protograph formed with column region C3 and row region R4).

Subsequently, in the same way as above, row process or column process is applied in process <7>, process <8>, and so on. Here, row process refers to the process corresponding to above step A•2. Also, when β is already updated, that updated value is used. Similarly, column process refers to the process corresponding to above step A•3. Also, when α is already updated, that updated value is used.

By adopting the above algorithms, compared to sum-product decoding, it is possible to provide an advantage of reducing the number of iterations to acquire good received quality. Also, even compared to shuffled BP decoding disclosed in Non-Patent Document 3, it is possible to provide an advantage of reducing the number of iterations to acquire good received quality.

Next, a BP decoding method different from the BP decoding method explained in FIG. 6 will be explained using FIG. 7. The BP decoding method explained in FIG. 7 also presumes using check matrix H separated as above (in FIG. 5).

Process <1>: Row process is applied to the positions where "1's" are present in the protographs formed with the first to fourth columns and the first to fourth rows (i.e. the protograph formed with column region C1 and row region R1 and the protograph formed with column region C1 and row region R2).

Process <2>: Column process is applied to the positions where "1's" are present in the protographs formed with the first to fourth columns and the first to fourth rows (i.e. the protograph formed with column region C1 and row region R1 and the protograph formed with column region C1 and row region R2).

Process <3>: Row process is applied to the positions where "1's" are present in the protograph formed with the first to fourth columns and the first to second rows (i.e. the protograph formed with column region C1 and row region R1). In addition, row process is applied to the positions where "1's" are present in the protographs formed with the first to eighth columns and the third to fourth rows (i.e. the protograph formed with column region C1 and row region R2 and the protograph formed with column region C2 and row region R2). In addition, row process is applied to the positions where "1's" are present in the protograph formed with the fifth to eighth columns and the fifth to sixth rows (i.e. the protograph formed with column region C2 and row region R3).

Process <4>: Column process is applied to the positions where "1's" are present in the protographs formed with the first to fourth columns and the first to fourth rows (i.e. the protograph formed with column region C1 and row region R1 and the protograph formed with column region C1 and row region R2). In addition, column process is applied to the positions where "1's" are present in the protographs formed with the fifth to eighth columns and the third to sixth rows (i.e. the protograph formed with column region C2 and row region R2 and the protograph formed with column region C2 and row region R3).

Process <5>: Row process is applied to the positions where "1's" are present in the protographs formed with the first to eighth columns and the third to fourth rows (i.e. the protograph formed with column region C1 and row region R2 and the protograph formed with column region C2 and row region R2). In addition, row process is applied to the positions where "1's" are present in the protographs formed with the fifth to twelfth columns and the fifth to sixth rows (i.e. the protograph formed with column region C2 and row region R3 and the protograph formed with column region C3 and row region R3).

Process <6>: Column process is applied to the positions where "1's" are present in the protographs formed with the first to fourth columns and the first to fourth rows (i.e. the protograph formed with column region C1 and row region R1 and the protograph formed with column region C1 and row region R2). In addition, column process is applied to the positions where "1's" are present in the protographs formed with the fifth to eighth columns and the third to sixth rows (i.e. the protograph formed with column region C2 and row region R2 and the protograph formed with column region C2 and row region R3). In addition, column process is applied to the positions where "1's" are present in the protographs formed with the ninth to twelfth columns and the fifth to eighth rows (i.e. the protograph formed with column region C3 and row region. R3 and the protograph formed with column region C3 and row region R4).

Subsequently, in the same way as above, row process or column process is applied in process <7>, process <8>, and so on. Here, row process refers to the process corresponding to above step A•2. Also, when β is already updated, that updated value is used. Similarly, column process refers to the process corresponding to above step A•3. Also, when α is already updated, that updated value is used.

Figure 6:
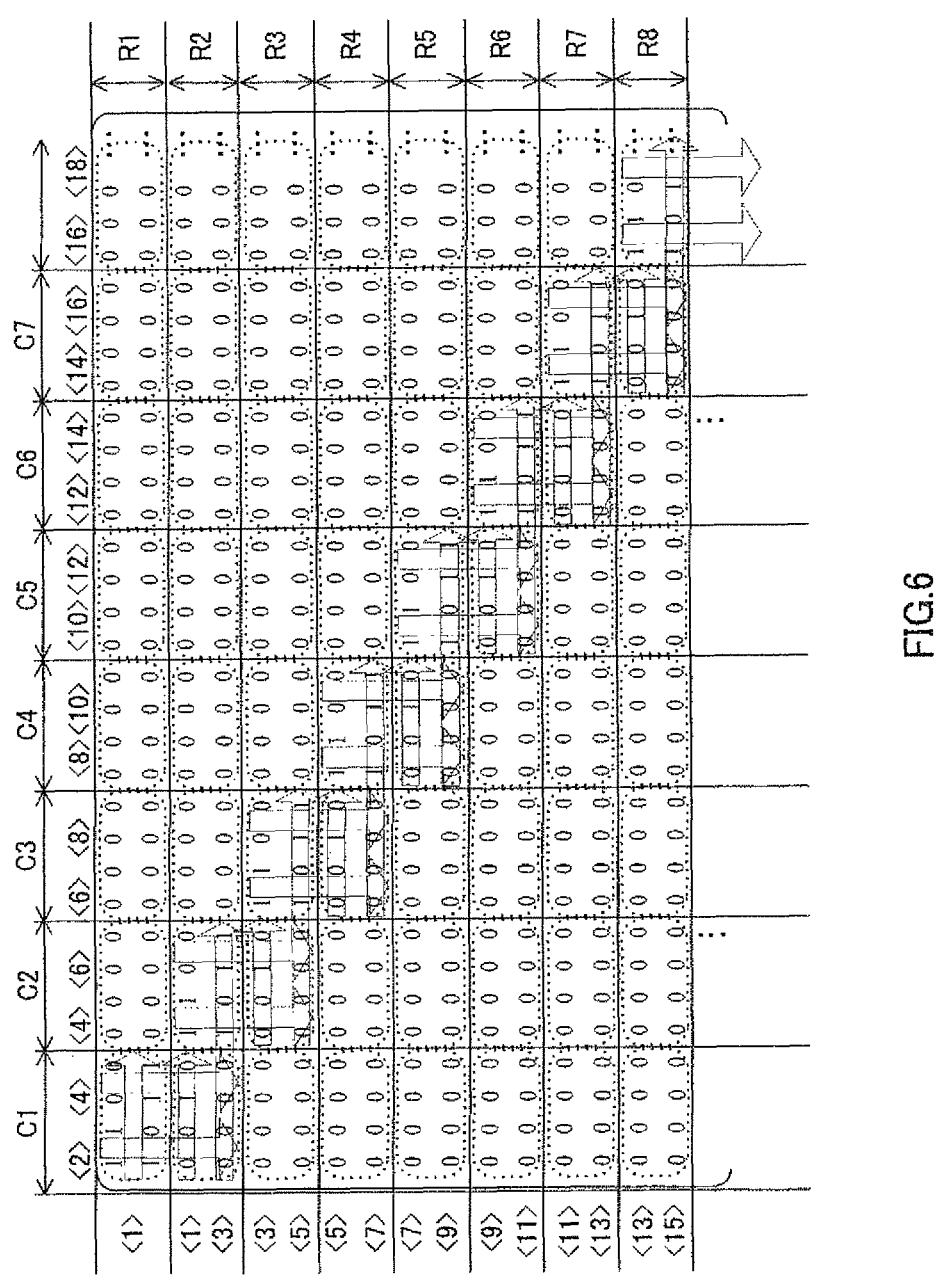

By adopting the above algorithms, similar to the algorithms in FIG. 6, compared to sum-product decoding, it is possible to provide an advantage of reducing the number of iterations to acquire good received quality. Also, even compared to shuffled BP decoding disclosed in Non-Patent Document 3, it is possible to provide an advantage of reducing the number of iterations to acquire good received quality.

(2) Configuration

Figure 8:
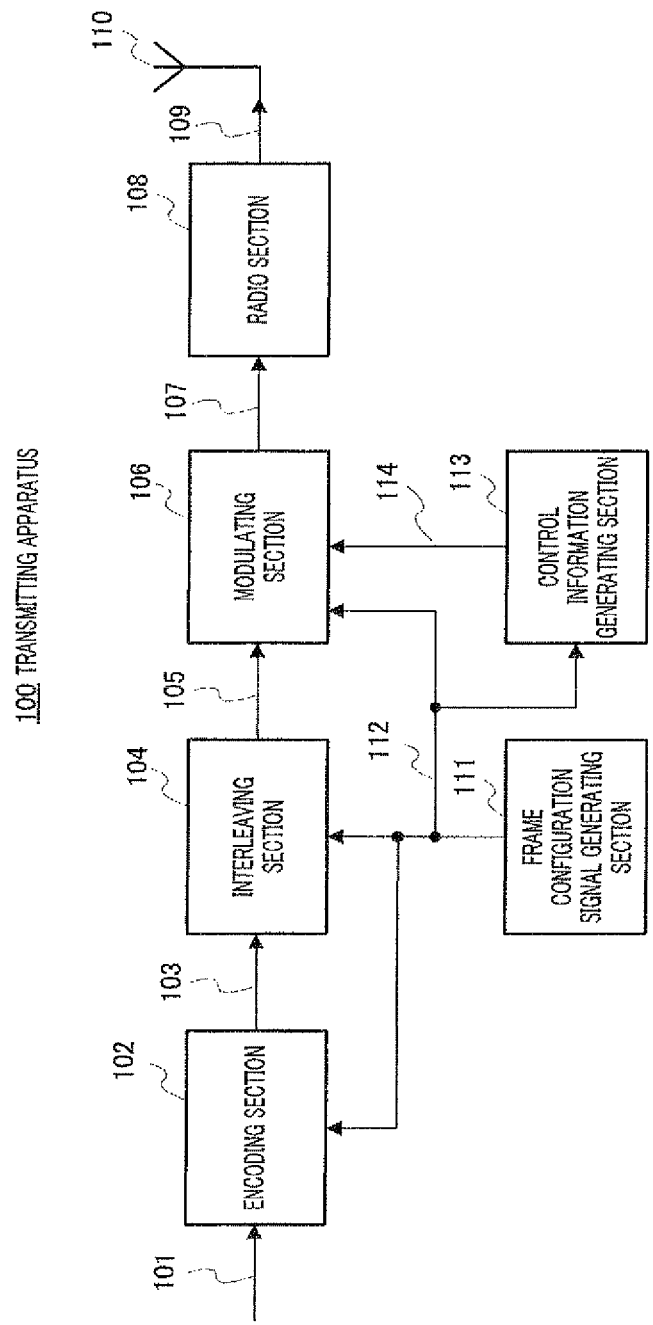
FIG. 8 is a block diagram showing a configuration example of a transmitting apparatus that performs LDPC-CC coding.

FIG. 8 shows a configuration example of the transmitting apparatus of the present embodiment. Encoding section 102 performs LDPC-CC coding of transmission digital signal 101 and outputs the resulting encoded data 103 to interleaving section 104.

Interleaving section 104 receives as input encoded data 103 and frame configuration signal 112, interleaves encoded data 103 based on the frame configuration indicated by frame configuration signal 112, and outputs the resulting interleaved data 105 to modulating section 106.

Modulating section 106 receives as input interleaved data 105, control information 114 and frame configuration signal 112, modulates interleaved data 105 and control information 114 and forms a transmission frame based on the modulation scheme and frame configuration indicated by frame configuration signal 112, and outputs the resulting modulation signal 107 to radio section 108. Radio section 108 performs predetermined radio processing such as frequency conversion and amplification on modulation signal 107, and supplies the resulting transmission signal 109 to antenna 110.

Frame configuration generating section 111 outputs frame configuration signal 112 including frame configuration information. Control information generating section 113 receives as input frame configuration signal 112, generates and outputs control information 114 including information for allowing the communicating party to find frequency synchronization and time synchronization and information for notifying the communicating party of the modulation scheme of the modulation signal.

Figure 9:
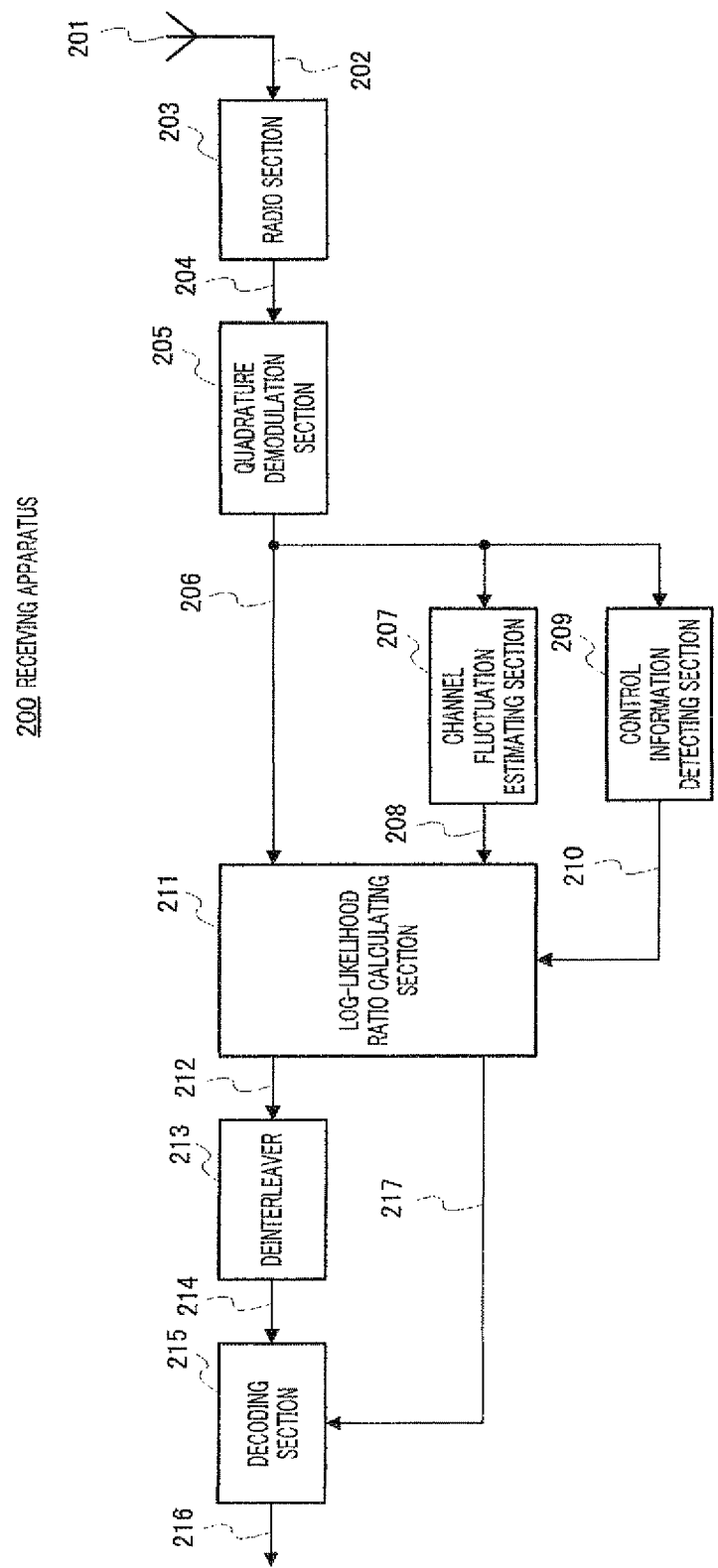
FIG. 9 is a block diagram showing a configuration example of a receiving apparatus that performs LDPC-CC decoding.

FIG. 9 shows a configuration example of the receiving apparatus of the present embodiment.

Radio section 203 performs predetermined receiving processing such as amplification and frequency conversion on received signal 202 received by receive antenna 201, and outputs the resulting modulation signal 204 to quadrature demodulating section 205. Quadrature demodulating section 205 performs quadrature demodulation of modulation signal 204, and outputs the resulting baseband signal 206 to channel fluctuation estimating section 207, control information detecting section 209 and log-likelihood ratio calculating section 211.

Channel fluctuation estimating section 207 detects, for example, the preamble from base band signal 206, estimates channel fluctuation based on this preamble, and outputs channel fluctuation estimation signal 208 to log-likelihood ratio calculating section 211. Control information detecting section 209 detects the preamble from base band signal 206, finds time synchronization and frequency synchronization of baseband signal 206 based on this preamble, extracts the control information except for transmission data from synchronized baseband signal 206, and outputs this control information as control signal 210.

Log-likelihood ratio calculating section 211 receives as input baseband signal 206, channel fluctuation estimation signal 208 and control signal 210, and, for example, as disclosed in Non-Patent Documents 5, 6 and 7, finds log-likelihood ratios per bit and outputs log-likelihood ratio signal 212. Further, log-likelihood ratio calculating section 211 outputs timing signal 217 showing the data period (e.g. block size).

Deinterleaver 213 receives as input log-likelihood ratio signal 212, returns the order of log-likelihood ratio signal 212 to the order before interleaving in interleaving section 104 (FIG. 8), and outputs the resulting deinterleaved log-likelihood ratio signal 214 to decoding section 215.

Decoding section 215 receives as input deinterleaved log-likelihood ratio signal 214 and timing signal 217, and acquires received data 216 by decoding deinterleaved log-likelihood ratio signal 214.

Next, the configuration of decoding section 215 will be explained in detail. First, prior to explaining the configuration of the decoding section of the present embodiment, a general configuration for performing sum-product decoding will be explained using FIG. 10, and, next, a configuration example for realizing BP decoding according to the present embodiment will be explained using FIG. 11.

Figure 10:
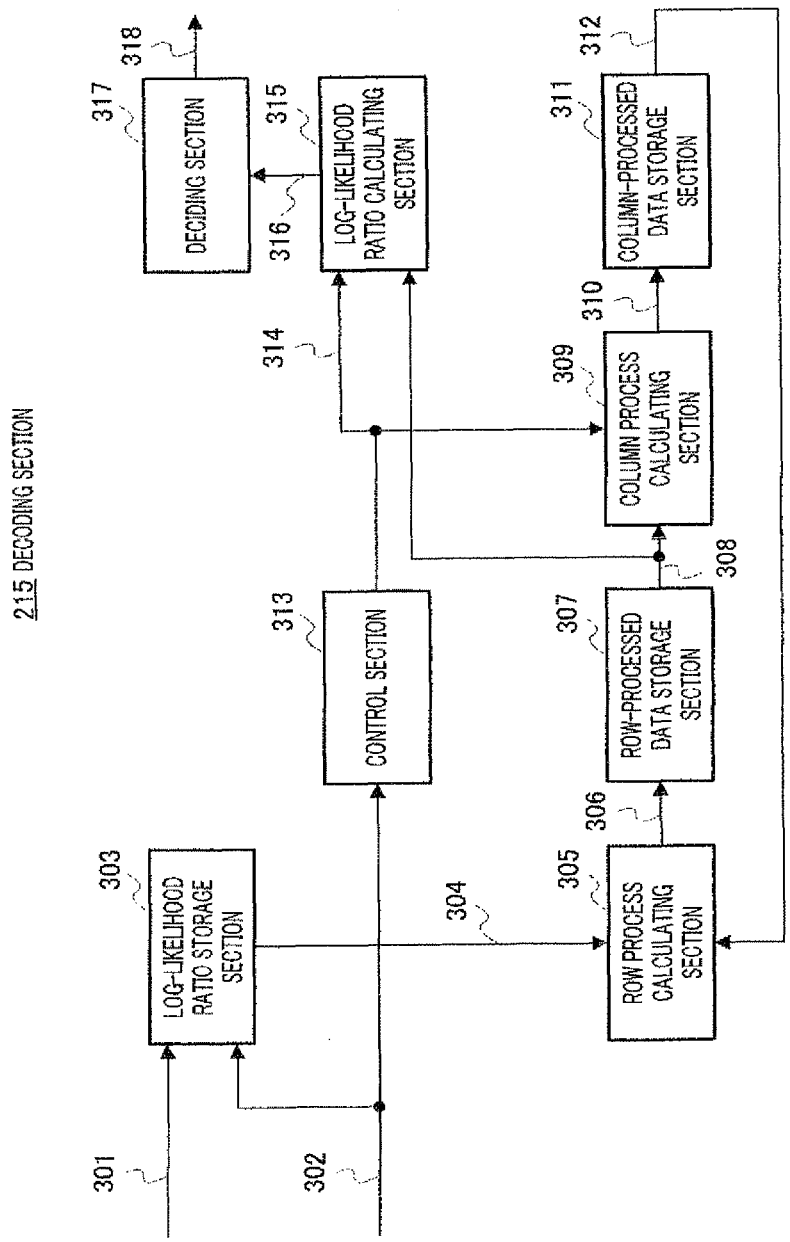
FIG. 10 is a block diagram showing a configuration example of a decoding section that performs sum-product decoding (BP decoding)

FIG. 10 shows a configuration example of decoding section 215 in FIG. 9 upon performing sum-product decoding.

Log-likelihood ratio storage section 303 receives as input log-likelihood ratio signal 301 (corresponding to log-likelihood ratio signal 214 in FIG. 9) and timing signal 302 (corresponding to timing signal 217 in FIG. 9) and stores a log-likelihood ratio in a data period based on timing signal 302. The stored log-likelihood ratio is outputted as appropriate when necessary.

Row process calculating section 305 receives as input log-likelihood ratio signal 304 and column-processed signal 312, and performs the calculation of above step A•2 (row process) in the positions where "1's" are present in parity check matrix H. In fact, decoding section 215 performs iterative decoding, and therefore row process calculating section 305 performs row process using log-likelihood ratio signal 304 (corresponding to the process of above step A•1) upon the first decoding and using column-processed signal 312 upon second decoding.

Row-processed signal 306 is stored in row-processed data storage section 307. Row-processed data storage section 307 stores all row-processed values (signals).

Column process calculating section 309 receives as input row-processed signal 308 and control signal 314, checks from control signal 314 that iterative calculation is not final, and performs the calculation of above step A•3 (column process) in the positions where "1's" are present in parity check matrix H.

Column-processed signal 310 is stored in column-processed data storage section 311. Column-processed data storage section 311 stores all column-processed values (signals).

Control section 313 counts the number of iterations based on timing signal 302 and outputs the number of iterations as control signal 314.

Log-likelihood ratio calculating section 315 receives as input row-processed signal 308 and control signal 314, and, upon deciding based on control signal 314 that iterative calculation is final, performs the calculation of above step A•4 using row-processed signal 308 (i.e. calculation of log-likelihood ratios) in the positions where "1's" are present in parity check matrix H, to acquire log-likelihood ratio signal 316. Log-likelihood ratio signal 316 is outputted to deciding section 317.

Deciding section 317 estimates a codeword by, for example, executing equation 9 using log-likelihood ratio signal 317, and outputs estimated bits 318 (corresponding to received data 216 in FIG. 9).

Next, a configuration example for realizing BP decoding according to the present embodiment will be explained using FIG. 11.

Figure 11:
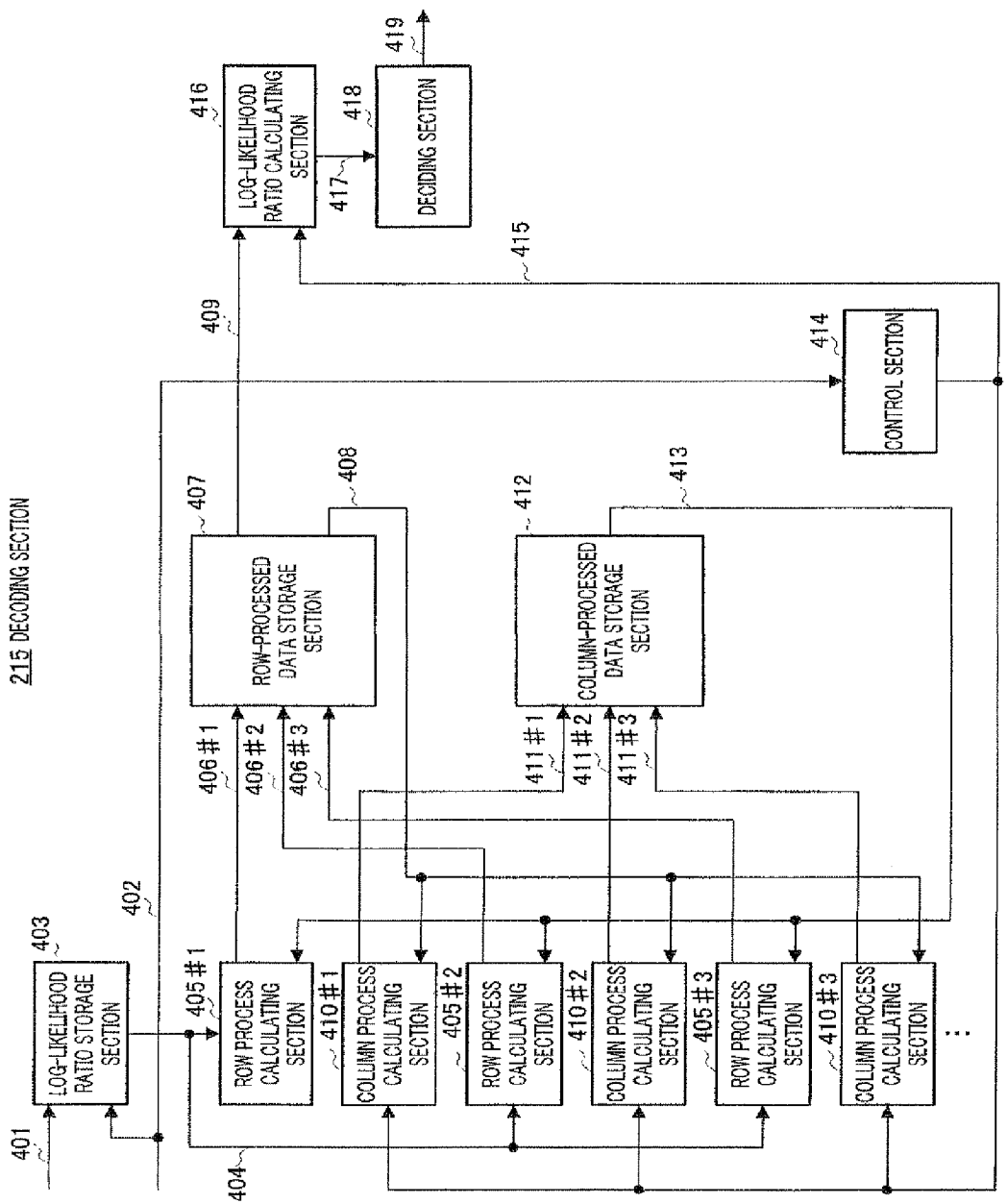
FIG. 11 is a block diagram showing a configuration example of a decoding section that performs BP decoding according to Embodiment 1.

FIG. 11 shows a configuration example of decoding section 215 in FIG. 9 for realizing BP decoding according to the present embodiment. That is, decoding section 215 in FIG. 11 employs a configuration example for realizing BP decoding explained in FIGS. 6 and 7.

Log-likelihood ratio storage section 403 receives as input log-likelihood ratio signal 401 (corresponding to log-likelihood ratio signal 214 in FIG. 9) and timing signal 402 (corresponding to timing signal 217 in FIG. 9), and stores a log-likelihood ratio in a data period based on timing signal 402. The stored log-likelihood ratio is outputted as appropriate when necessary.

Figure 7:
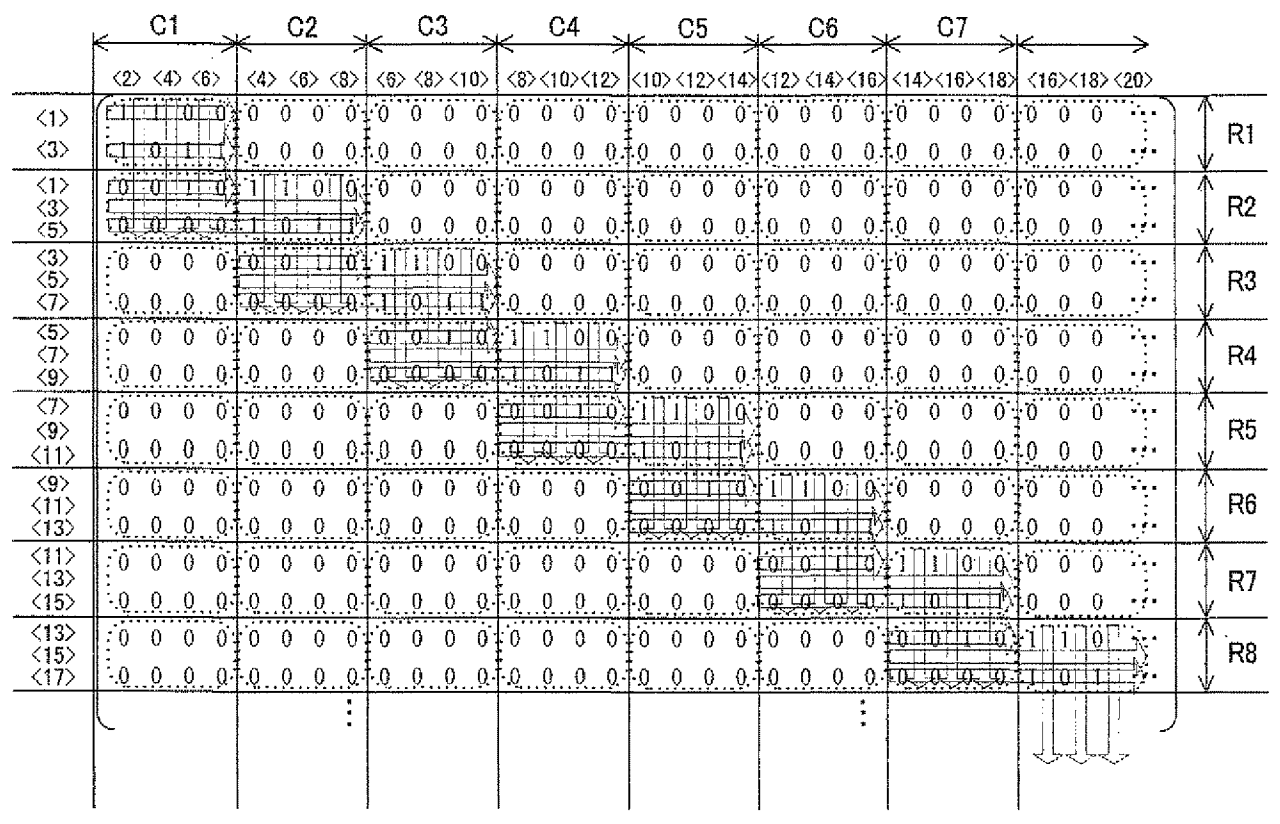

Row process calculating section 405 #1 refers to the calculating section for performing the row process of process <1> in FIG. 6 or FIG. 7, and receives as input log-likelihood ratio signal 404 and column-processed signal 413. Upon the first decoding, row process calculating section 405 #1 performs the row process of process <1> in FIG. 6 or FIG. 7 using log-likelihood ratio signal 404. Upon second decoding, row process calculating section 405 #1 performs the row process of process <1> in FIG. 6 or FIG. 7 using column-processed signal 413.

Row processed signal 406 #1 acquired in row process calculating section 405 #1 is stored in row-processed data storage section 407. Row-processed data storage section 407 updates only row-processed signal 406 #1 among the stored row-processed data.

Column process calculating section 410 #1 refers to the calculating section for performing the column process of process <2> in FIG. 6 or FIG. 7, and receives as input row-processed signal 408 and control signal 415. By performing the column process of process <2> in FIG. 6 or FIG. 7, column process calculating section 410 #1 acquires column-processed signal 411 #1.

Column-processed signal 411 #1 acquired in column process calculating section 410 #1 is stored in column-processed data storage section 412. Column-processed data storage section 412 updates only column-processed signal 411 #1 among the stored column-processed data.

Row process calculating section 405 #2 refers to the calculating section for performing the row process of process <3> in FIG. 6 or FIG. 7, and receives as input log-likelihood ratio signal 404 and row-processed signal 413. Upon the first decoding, row process calculating section 405 #2 performs the row process of process <3> in FIG. 6 or FIG. 7 using log-likelihood ratio signal 404. Upon second decoding, row process calculating section 405 #2 performs the row process of process <3> in FIG. 6 or FIG. 7 using column-processed signal 413.

Row processed signal 406 #2 acquired in row process calculating section 405 #2 is stored in row-processed data storage section 407. Row-processed data storage section 407 updates only row-processed signal 406 #2 among the stored row-processed data.

Column process calculating section 410 #2 refers to the calculating section for performing the column process of process <4> in FIG. 6 or FIG. 7, and receives as input row-processed signal 408 and control signal 415. By performing the column process of process <4> in FIG. 6 or FIG. 7, column process calculating section 410 #2 acquires column-processed signal 411 #2.

Column-processed signal 411 #2 acquired by column process calculating section 410 #2 is stored in column-processed data storage section 412. Column-processed data storage section 412 updates only column-processed signal 411 #2 among the column-processed data.

The same calculations as above are performed even in the row process calculating sections after row process calculating section 405 #3 and the column process calculating sections after column process calculating section 410 #3. By this means, the processes after process <5> in FIG. 6 or FIG. 7 are performed, and row-processed data and column-processed data are updated sequentially.

Control section 414 counts the number of iterations based on timing signal 402 and outputs the number of iterations as control signal 415.

Log-likelihood ratio calculating section 416 receives as input row-processed signal 409 and control signal 415, finds a log-likelihood ratio in the final iterative calculation and outputs it as log-likelihood ratio signal 417.

Deciding section 418 estimates a codeword by executing equation 9 using log-likelihood ratio signal 417, and outputs estimated bits 419 (corresponding to received data 216 in FIG. 9).

As described above, by employing the configuration shown in FIG. 11, it is possible to implement BP decoding explained in FIG. 6 and FIG. 7.

Also, to realize BP decoding explained in FIG. 6, each of row process calculating sections 405 #1, 405 #2, and so on, and each of column process calculating sections 410 #1, 410 #2, and so on, need to process protographs as shown in FIG. 6. On the other hand, to realize BP decoding explained in FIG. 7, each of row process calculating sections 405 #1, 405 #2, and so on, and each of column process calculating sections 410 #1, 410 #2, and so on, need to process protographs as shown in FIG. 7. If the configuration shown in FIG. 11 is employed, only by common basic operations, it is possible to implement BP decoding explained in FIG. 6 and FIG. 7.

As described above, according to the present embodiment, when the degree of a check equation by check matrix H is D and the check equation of the (j+1)-th row and the check equation of the j-th row in LDPC-CC check matrix H are shifted by n bits from each other, calculations are performed using, as a process unit of row process calculation and column process calculation, protographs formed by separating the columns of check matrix H per "(D+1)×N (natural number)" and separating the rows of check matrix H per "(D+1)×N/n."

By this means, it is possible to perform fast BP decoding while inheriting the updated values (i.e. probability propagation) well between row process calculations and column process calculations. Actually, it is an important factor in realizing good probability propagation to divide check matrix H into a total of three types of protographs P1, P2 and P3, where two patterns of protographs P1 and P2 are formed with "1's" and "0's," and protograph P3 is formed with only "0's."

Also, a case has been described above with the present embodiment where the present invention is applied to an LDPC-CC, the present invention is not limited to this, and is equally applicable to, for example, a convolutional code disclosed in Non-Patent Document 8. That is, the BP decoding method of the present embodiment is applicable to even the case of preparing check matrix H with respect to a convolutional code disclosed in Non-Patent Document 8 and performing BP decoding. Even in this case, it is possible to provide the same effect as in the above embodiment.

Also, the present invention is widely applicable to various BP decoding. That is, the BP decoding of the present invention covers, for example, min-sum decoding, offset BP decoding and normalized BP decoding, which are disclosed in Non-Patent Documents 9 to 11 and similar to BP decoding. The same applies to embodiments which will be explained below.

Embodiment 2

Embodiment 1 has described a method and configuration for acquiring good received quality with a small calculation scale in LDPC-CC BP decoding.

The present embodiment proposes a method and configuration for enabling faster BP decoding than Embodiment 1 by sharing the basic principle and basic configuration of Embodiment 1 and improving Embodiment 1.

In Embodiment 1, the processes explained using FIGS. 6 and 7 and the configuration in FIG. 1 perform message exchanges sequentially. By contrast with this, with the present embodiment, as shown in FIG. 12, by dividing processes <1>, <2>, and so on, which are row processes and column processes in FIG. 6 and FIG. 7, into group units and performing processes on a per group basis, it is possible to alleviate the process delay by sequential processes and perform fast BP decoding.

Figure 12:
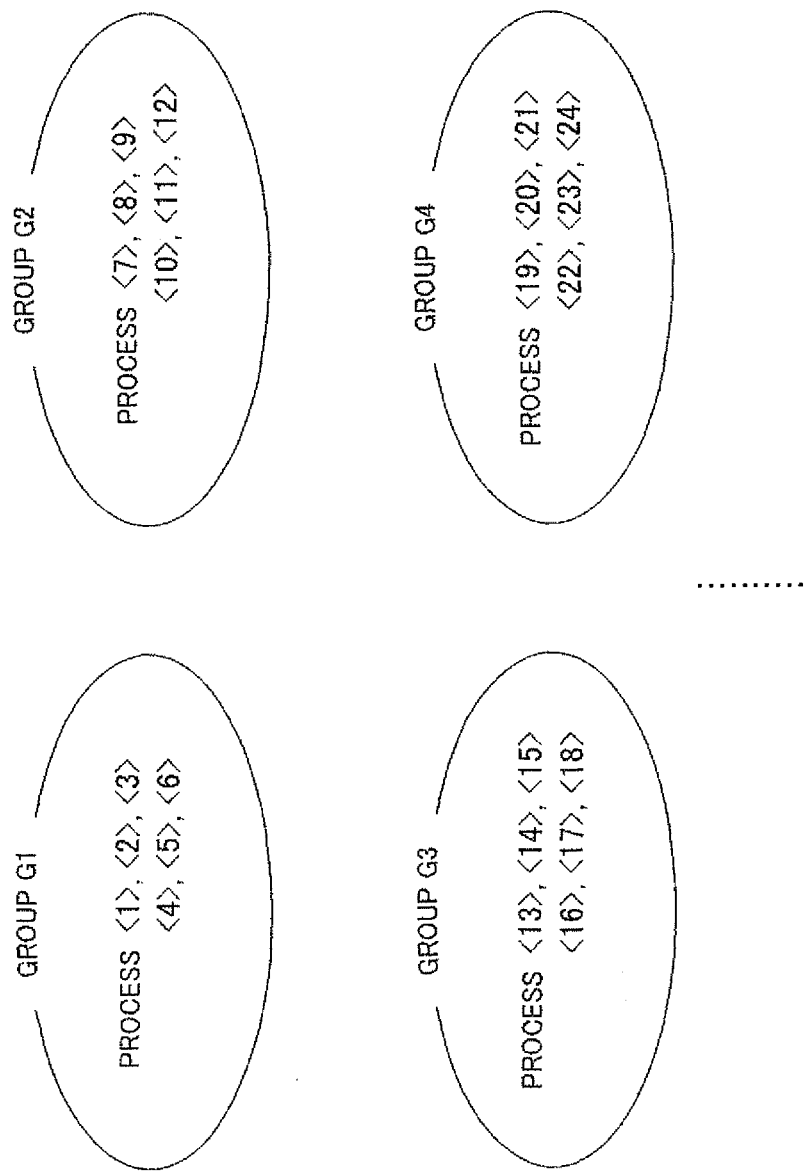
FIG. 12 illustrates grouping row process calculations and column process calculations

In FIG. 12, processes <1>, <2>, and so on, correspond to the row processes and column processes of processes <1>, <2>, and so on, in FIG. 6 or FIG. 7 explained in Embodiment 1. In the example of FIG. 12, processes <1>, <2>, <3>, <4>, <5> and <6> form one process group G1, processes <7>, <8>, <9>, <10>, <11> and <12> form one process group G2, processes <13>, <14>, <15>, <16>, <17> and <18> form one process group G3, and processes <19>, <20>, <21>, <22>, <23> and <24> form one process group G4. That is, all processes <1>, <2>, and so on, are divided into groups of six processes.

Figure 13:
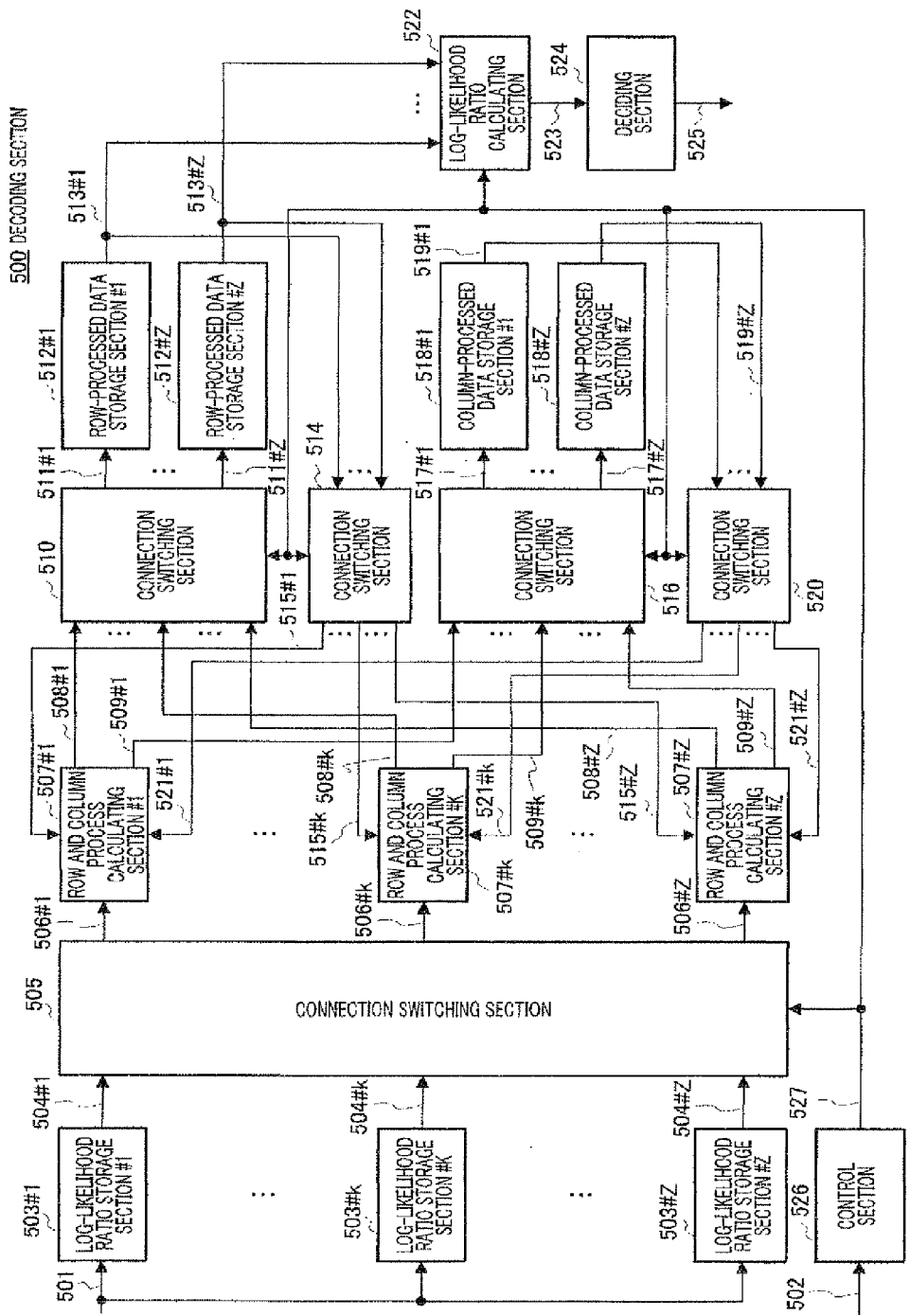
FIG. 13 is a block diagram showing a configuration example of a decoding section that performs BP decoding according to Embodiment 2.

FIG. 13 shows a configuration example of the decoding section according to the present embodiment. Decoding section 500 in FIG. 13 is used as, for example, decoding section 215 in FIG. 9.

Log-likelihood ratio storage section #1 (503 #1) receives as input log-likelihood ratio signal 501 (corresponding to log-likelihood ratio signal 214 in FIG. 9), stores log-likelihood ratios belonging to the processes of group G1 in FIG. 12 and outputs the stored log-likelihood ratios as signal 504 #1.

Similarly, log-likelihood ratio storage section #k (503 #k) receives as input log-likelihood ratio signal 501 (corresponding to log-likelihood ratio signal 212 in FIG. 9), stores log-likelihood ratios belonging to the processes of group Gk (1<k<Z) in FIG. 12 and outputs the stored log-likelihood ratios as signal 504 #k. Also, log-likelihood ratio storage section #Z (503 #Z) receives as input log-likelihood ratio signal 501 (corresponding to log-likelihood ratio signal 212 in FIG. 4), stores log-likelihood ratios belonging to the processes of group GZ in FIG. 12 and outputs the stored log-likelihood ratios as signal 504 #Z.

Connection switching section 505 receives as input log-likelihood ratio signals 504 #1 to 504 #Z belonging to the processes of groups G1 to GZ and control signal 527, switches input and output connections based on control signal 527, and outputs log-likelihood ratio signals 506 #1 to 506 #Z to row and column process calculating sections #1 to #Z (507 #1 to 507 #Z) in later stages. Also, the operations of connection switching section 505 will be described later in detail.

Row and column process calculating section #1 (507 #1) receives as input log-likelihood ratio signal 506 #1 from connection switching section 505, row-processed data #1 (515 #1) from connection switching section 514 and column-processed data #1 (521 #1) from connection switching section 520, and, by performing the same, row process and column process calculations as explained in Embodiment 1 using FIG. 11, acquires row-processed data 508 #1 and column-processed data 509 #1.

Row and column process calculating section #k (507 #k) receives as input log-likelihood ratio signal 506 #k from connection switching section 505, row-processed data #k (515 #k) from connection switching section 514 and column-processed data #k (521 #k) from connection switching section 520, and, by performing the same, row process and column process calculations as explained in Embodiment 1 using FIG. 11, acquires row-processed data 508 #k and column-processed data 509 #k.

Row and column process calculating section #Z (507 #Z) receives as input log-likelihood ratio signal 506 #Z from connection switching section 505, row-processed data #Z (515 #Z) from connection switching section 514 and column-processed data #Z (521 #Z) from connection switching section 520, and, by performing the same, row process and column process calculations as explained in Embodiment 1 using FIG. 11, acquires row-processed data 508 #Z and column-processed data 509 #Z.

The process content of row and column process calculating sections #1 to #Z (507 #1 to 507 #Z) will be described later in detail.

Connection switching section 510 receives as input row-processed data 508 #1 to 508 #Z and control signal 527, switches input and output connections based on control signal 527 and outputs row-processed data 511 #1 to 511 #Z to row-processed data storage sections #1 to #Z (512 #1 to 512 #Z) in later stages. Also, the operations of connection switching section 510 will be described later in detail.

Row-processed data storage section #1 (512 #1) updates only row-processed data 511 #1 among the storage row-processed data. Further, row-processed data storage section #1 (512 #1) outputs row data 513 #1 for performing column process.

Similarly, row-processed data storage section #Z (512 #Z) updates only row-processed data 511 #Z among the storage row-processed data. Further, row-processed data storage section #Z (512 #Z) outputs row data 513 #Z for performing column process.

Connection switching section 514 receives as input row data 513 #1 to 513 #Z and control signal 527, switches the input and output connections based on control signal 527 and outputs row data 515 #1 to 515 #Z after connection switch to row and column process calculating sections #1 to #Z (507 #1 to 507 #Z). Also, the operations of connection switching section 514 will be described later in detail.

Connection switching section 516 receives as input column-processed data 509 #1 to 509 #Z and control signal 527, switches the input and output connections based on control signal 527 and outputs column-processed data 517 #1 to 517 #Z to row and column-processed data storage sections #1 to #Z (518 #1 to 518 #Z). Also, the operations of connection switching section 516 will be described later in detail.

Column-processed data storage section #1 (518 #1) updates only column-processed data 517 #1 among the stored column-processed data. Further, column-processed data storage section #1 (518 #1) outputs column data 519 #1 for performing row process. Similarly, column-processed data storage section #Z (518 #Z) updates only column-processed data 517 #Z among the stored column-processed data. Further, column-processed data storage section ∩Z (518 #Z) outputs column data 519 #Z for performing row process.

Connection switching section 520 receives as input column data 519 #1 to 519 #Z and control signal 527, switches the input and output connections based on control signal 527 and outputs column data 521 #1 to 521 #Z after connection switch to row and column process calculating sections #1 to #Z (507 #1 to 507 #Z). Also, the operations of connection switching section 520 will be described later in detail.

Control section 526 receives as input timing signal 502, generates control signal 527 based on timing signal 502 and outputs this.

Log-likelihood ratio calculating section 522 receives as input row data 513 #1 to 513 #Z and control signal 527, and, upon deciding based on control signal 527 that iterative calculation is final, finds the log-likelihood ratios by calculation and outputs log-likelihood ratio signal 523.

Deciding section 524 receives as input log-likelihood ratio signal 523, estimates a codeword by executing, for example, equation 9 using log-likelihood ratio signal 523, and outputs the resulting estimated bits 525.

The above is the basic operations of decoding section 500. Next, the relationship between the configuration of decoding section 500 in FIG. 13 and a schedule of row and column processes in FIG. 12 will be explained in detail using FIG. 14 and FIG. 15. Here, a ease will be explained where the number of groups is Z.

Row-processed data storage section #1 (512 #1) stores row-processed data of group G1 (in FIG. 12). Similarly, row-processed data storage section #Z (512 #Z) stores row-processed data of group GZ.

Column-processed data storage section #1 (518 #1) stores column-processed data of group G1. Similarly, column-processed data storage section #Z (518 #Z) stores column-processed data of group GZ.

Figure 14:
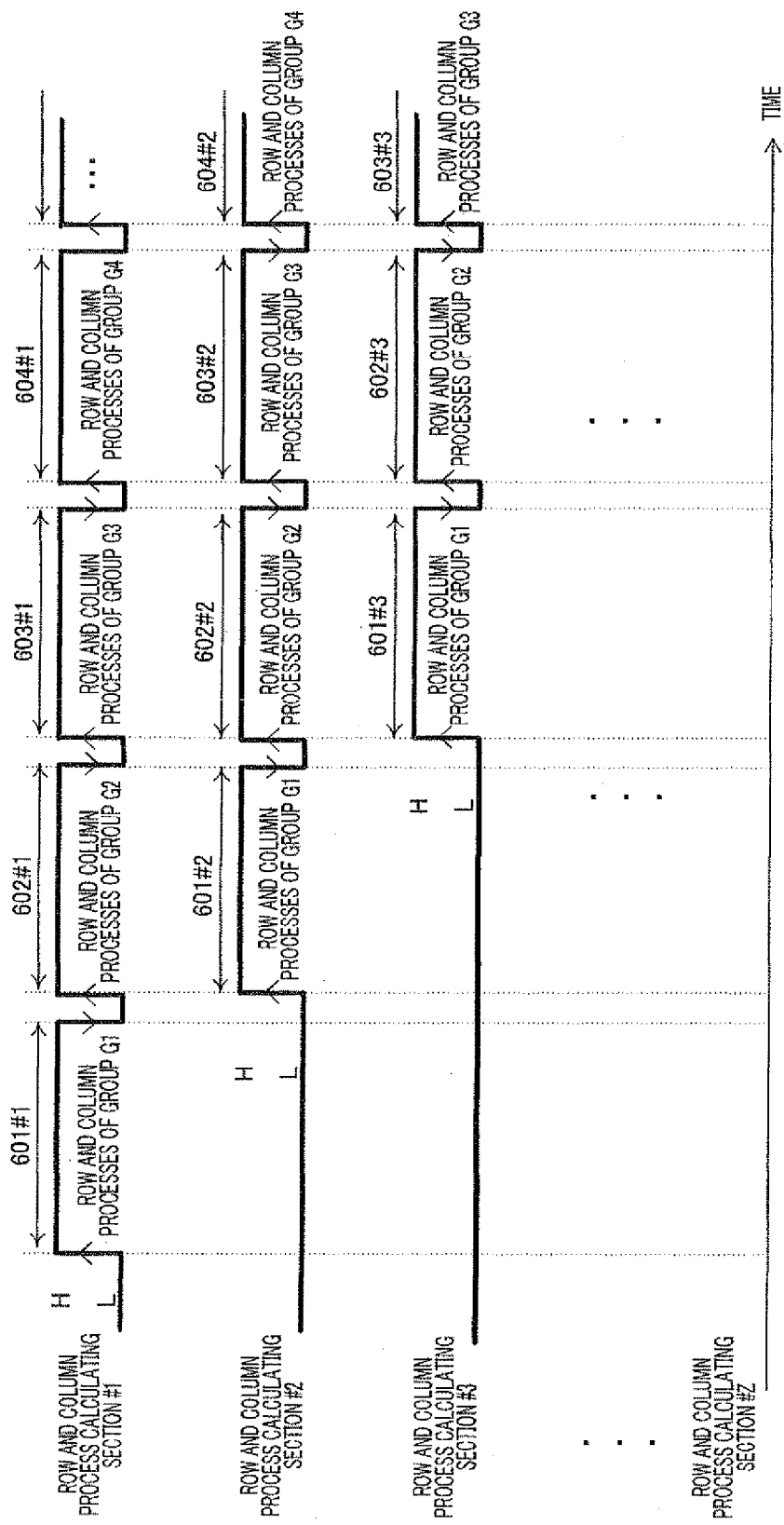
FIG. 14 is a timing chart illustrating the operations of a decoding section according to Embodiment 2.
Figure 15:
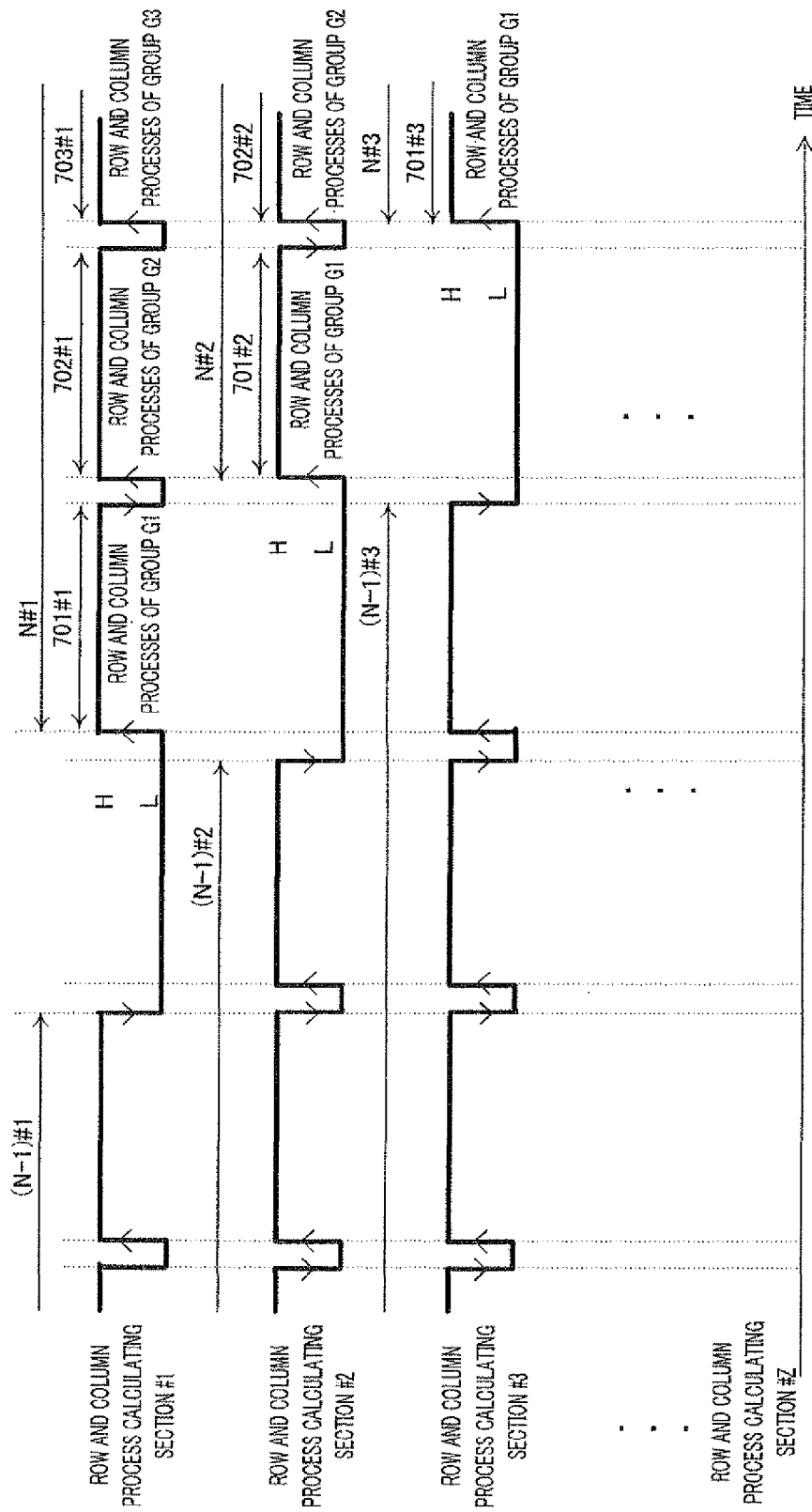
FIG. 15 is a timing chart illustrating the operations of a decoding section according to Embodiment 2.

FIG. 14 and FIG. 15 show the process timings of row and column process calculating sections #1 to #Z (507 #1 to 507 #Z) on the time axis. In FIG. 14 and FIG. 15, the period of "L (Low)" shows that row and column process operations are not performed, and the period of "H (High)" shows that row and column process operations are performed.

As shown in FIG. 14, row and column process calculating section #1 performs row and column processes of group G1 (in FIG. 12) in "H" period 601 #1. In this "H" period 601 #1, the rest of row and column process calculating sections #2 to #Z do not start iterative decoding operations yet.

Row and column process calculating section #1 performs row and column processes of group G1 (in FIG. 12) in "H" period 601 #1. In "H" period 601 #2 that is the same period as this "H" period 602 #1, row and column process calculating section #2 performs row and column processes of group G1. In these periods, the rest of row and column process calculating sections #3 to #Z do not start iterative decoding operations yet.

Row and column process calculating section #1 performs row and column processes of group G3 in "H" period 603 #1. In "H" period 602 #2 that is the same period as this "H" period 603 #1, row and column process calculating section #2 performs row and column processes of group G2. Also, in "H" period 601 #3 that is the same period as "H" period 603 #1, row and column process calculating section #3 performs row and column processes of group G1. In these periods, the rest of row and column process calculating sections #4 to #Z do not start iterative decoding operations yet.

As described above, row and column process calculating sections #1 to #Z start iterative decoding in order. Also, groups subject to row and column processes in row and column process calculating sections #1 to #Z are shifted one by one between row and column process calculating sections #1 to #Z over time. To realize these operations, connection switching sections 505, 510, 516 and 520 in FIG. 13 switch the input and output connections.

In process timings on the time axis in FIG. 15, period (N−1) #1 shows that row and column process calculating section #1 performs the (N−1)-th decoding. Similarly, period (N−1) #2 shows that row and column process calculating section #2 performs the (N−1)-th decoding. Thus, period (N−1) #k shows that row and column process calculating section #k performs the (N−1)-th decoding.

Also, period N #1 shows that row and column process calculating section #1 performs the N-th decoding. Similarly, period N #2 shows that row and column process calculating section #2 performs the N-th decoding. Thus, N #k period shows that row and column process calculating section #k performs the N-th decoding.

In periods of each iterative decoding, in the same way as explained in FIG. 14, groups subject to row and column processes in row and column process calculating sections #1 to #Z are shifted one by one between row and column process calculating sections #1 to #Z over time (see the right half of FIG. 15).

By performing such process, when all row and column process calculating sections #1 to #Z finish the N-th decoding process in decoding section 500 of the present embodiment, it is equivalent to performing decoding processes Z times as much as N decoding processes in decoding section 215 (in FIG. 11) in Embodiment 1, that is, it is equivalent to performing decoding processes Z×N times. Therefore, by employing the configuration of decoding section 500 of the present embodiment, it is possible to reduce the number of times of iterative decoding required to acquire good received quality, so that, compared to decoding section 215 in Embodiment 1, it is possible to shorten the process delay and perform fast BP decoding. That is, decoding section 500 performs decoding processes Z times as much as decoding processes in decoding section 215 by parallel process in one iterative decoding, and therefore the number of times of iterative decoding required to acquire the received quality equivalent to that of decoding section 215 is approximately 1/Z times, so that it is possible to acquire received quality equivalent to that of decoding section 215 in shorter time.

As described above, according to the present embodiment, by dividing row processes and column processes into a plurality of groups G1 to GZ, performing row processes and column processes of each of groups G1 to GZ sequentially in column and row process calculating sections #1 to #Z (507 #1 to 507 #Z), and performing these processes in parallel in the plurality of column and row process calculating sections #1 to #Z (507 #1 to 507 #Z) at different time, it is possible to perform faster BP decoding than in Embodiment 1.

Also, the method of group division of row processes and column processes is not limited to that shown in FIG. 12.

Also, although a case has been described above with the present embodiment where the present invention is applied to an LDPC-CC, the present invention is not limited to this, and is equally applicable to, for example, a convolutional code disclosed in Non-Patent Document 8. That is, the BP decoding method of the present embodiment is applicable to even the case of preparing check matrix H with respect to a convolutional code disclosed in Non-Patent Document 8 and performing BP decoding. Even in this case, it is possible to provide the same effect as in the above embodiment.

Embodiment 3

The present embodiment proposes an interleaving method on the transmitting side, which is suitable to a case of performing decoding explained in Embodiment 2 on the receiving side. As an example, the present embodiment will explain a configuration where interleaving is applied after performing coding.

Figure 16:
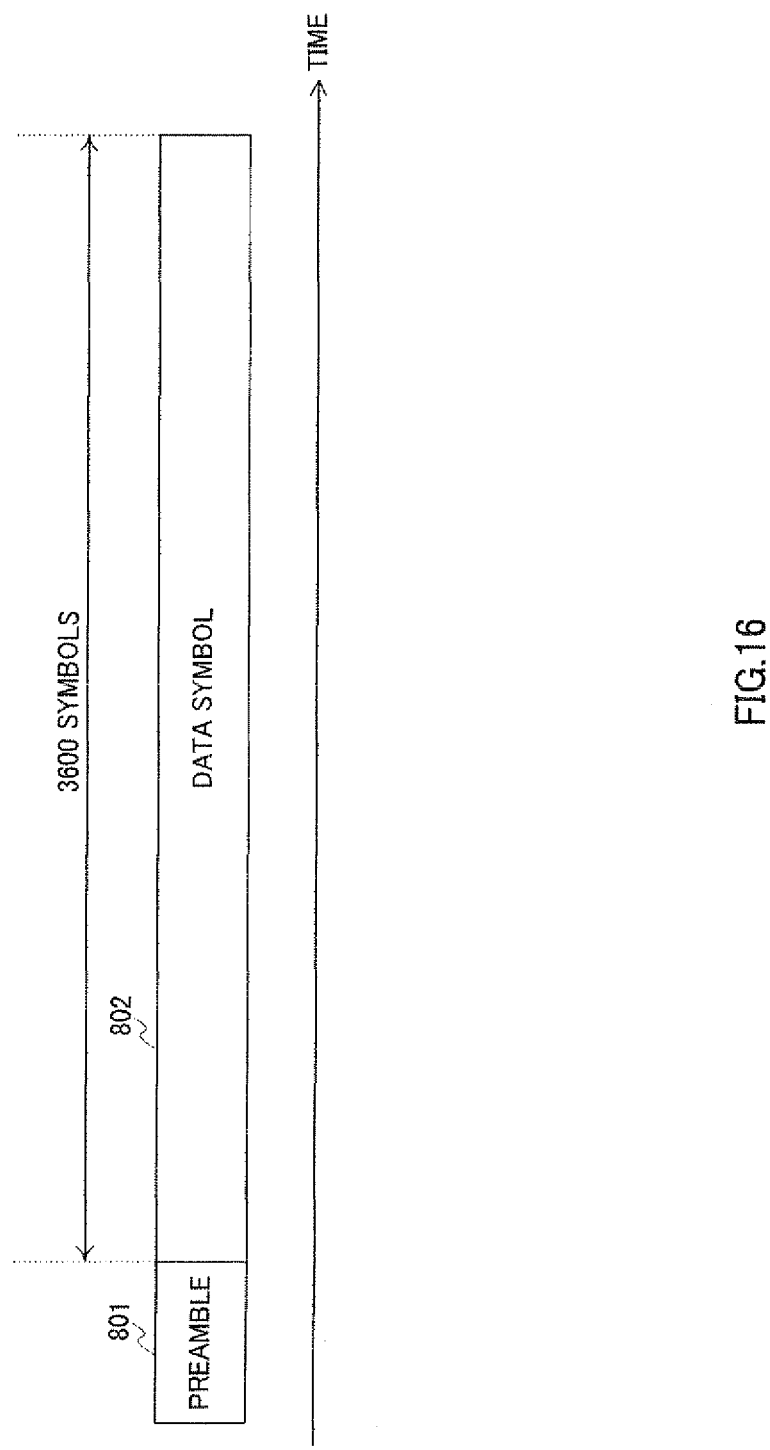
FIG. 16 shows a frame configuration example of a modulation signal transmitted.

FIG. 16 shows an example of a frame configuration (one frame) of a modulation signal, which is transmitted from transmitting apparatus 100 in FIG. 8, on the time axis. In FIG. 16, a modulation signal is formed with preamble 801 and data symbol 802. Preamble 801 includes pilot symbols for estimating channel fluctuation by a receiving apparatus, symbols for estimating frequency offset by the receiving apparatus and symbols for transmitting control information other than data.

Data symbol (i.e. symbol for transmitting data) 802 is subjected to, for example, LDPC-CC coding based on check matrix H in FIG. 3. In the present embodiment, assume that data symbol 802 of one frame is formed with 3600 symbols and subjected to BPSK modulation.

Figure 17:
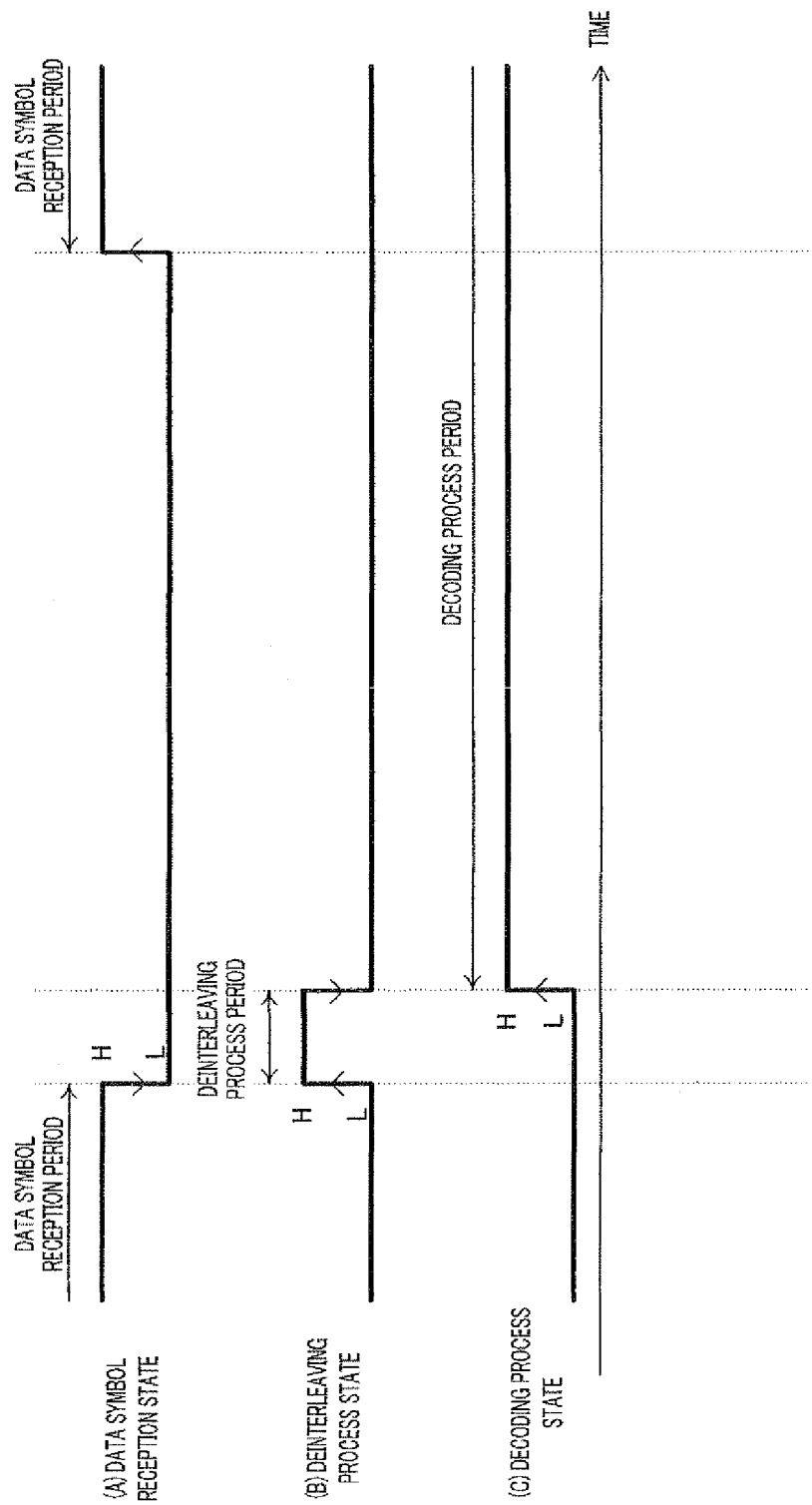
FIG. 17 is a timing chart showing a general signal processing timing on the receiving side.

FIG. 17 shows signal process timings on the receiving side in a case where, for example, interleaving section 104 in FIG. 8 performs random interleaving of data symbol 802 in FIG. 16 per one frame (i.e. 3600 symbols).

FIG. 17($a$) shows a reception state of data symbol 802 in a receiving apparatus. Here, assume that the receiving apparatus is in a state of receiving data symbol 802 in the "H" period and in a state of not receiving data symbol 802 in the "L" period.

FIG. 17($b$) shows a deinterleaving process state in the receiving apparatus. Here, assume that the receiving apparatus is in a state of performing deinterleaving in the "H" period and in a state of not performing deinterleaving in the "L" period.

As understood from FIG. 17($a$) and FIG. 17($b$), when applying random interleaving to data symbol 802 in FIG. 16 per one frame (3600 symbols), the receiving apparatus cannot apply deinterleaving unless the receiving apparatus has received all of the 3600 symbols.

FIG. 17($c$) shows a process state of a decoding section (see FIG. 11 and FIG. 13) in the receiving apparatus. Here, assume that the decoding section is in a state of performing decoding operations in the "H" period and in a state of not performing decoding operations in the "L" period.

Thus, when applying random interleaving per one frame (3600 symbols), as shown in FIG. 17, the deinterleaving operations cannot be started until all data symbols in one frame have been received. Also, the decoding operations (e.g. in FIG. 14 and FIG. 15) cannot be started until deinterleaving is finished (in FIG. 17($b$)).

Due to the above, process delay is caused. Therefore, the present embodiment proposes an interleaving method utilizing the features of dividing row and column processes into groups and sequentially processing the row and column processes of the divided groups in parallel, which are explained in Embodiment 2.

In the LDPC-CC coding process explained in Embodiment 1, when the degree of a check equation by check matrix H is D and the check equation of the (j+1)-th row and the check equation of the j-th row in LDPC-CC check matrix H are shifted by n bits from each other, calculations are performed using, as a process unit of row process calculation and column process calculation, protographs formed by separating the columns of cheek matrix H per "(D+1)×N (natural number)" and separating the rows of check matrix H per "(D+1)×N/n."

Therefore, by setting the interleaving block size to "(D+1)×N (natural number)×M (natural number)" bits and performing interleaving per this block size, the interleaving block size is integral multiples of the block size in the divided groups shown in FIG. 12, so that it is possible to perform deinterleaving process for all received bits without causing the waiting time as explained in FIG. 17. As a result, it is possible to alleviate the process delay in the receiving apparatus.

Figure 18:
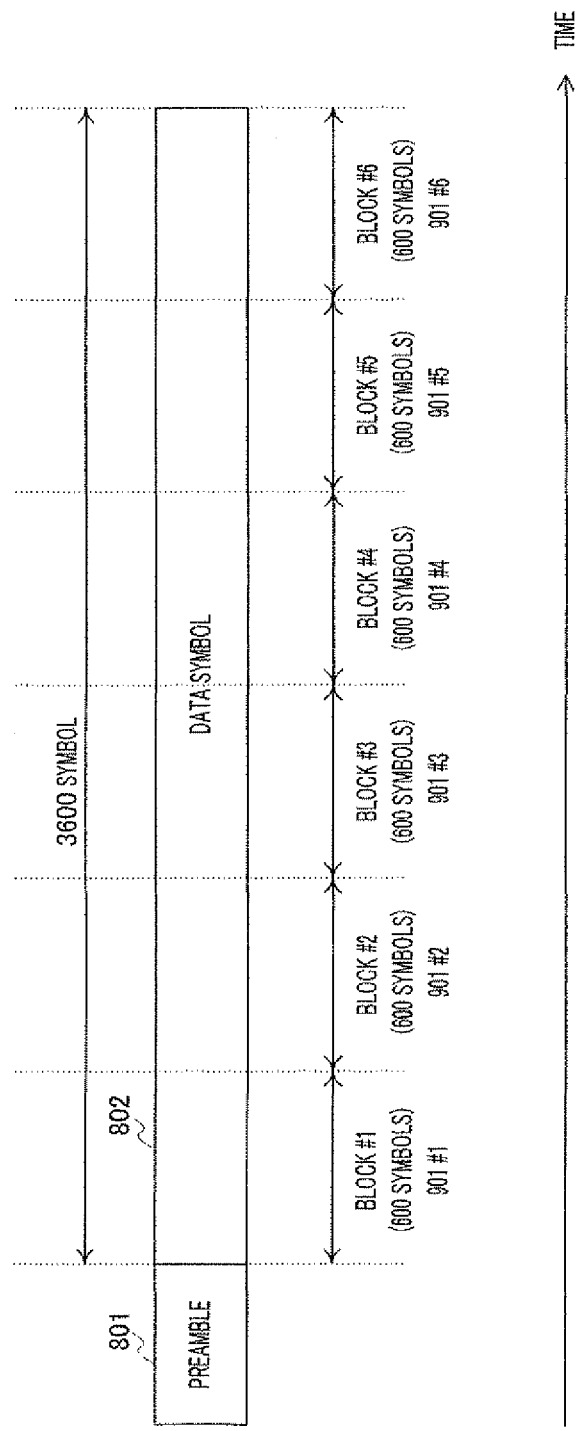
FIG. 18 illustrates a block division of a data symbol according to Embodiment 3.

For example, when dividing a check matrix as shown in FIG. 12, 4 (=degree+1) and N=1 are acquired. Taking into account this, as shown in FIG. 18, the present embodiment forms one block with 600 symbols by dividing data symbol 802 of 3600 symbols into six. By this means, in FIG. 18, data symbol 802 is formed with block #1 (901 #1), block #2 (901 #2), block #3 (901 #3), block #4 (901 #4), block #5 (901 #5) and block #6 (901 #6).

Further, in the present embodiment, interleaving is applied only in a block. For example, presuming that BPSK modulation is used, in interleaving section 104 (in FIG. 8), interleaving is applied using 600 bits forming block #1 (901 #1). Similarly, interleaving is applied using 600 bits forming block #2 (901 #2). That is, interleaving is applied using 600 bits forming block #k (901 #k) (k=1, 2, ... , 6). By this means, it is possible to realize interleaving process that satisfies the condition that the interleaving block size is set to "(degree+1)×N (natural number)×(natural number)" bits. This is because (degree+1)×1=(3+1)×1=4 and 600/4=150 (natural number).

By this means, the receiving apparatus can apply deinterleaving immediately after one block has been received, and start row and column process calculations immediately after deinterleaving is finished. Accordingly, as shown in FIG. 17, compared to the method for waiting deinterleaving until one frame has been received and waiting decoding until deinterleaving for one frame is finished, it is possible to shorten the calculation delay.

Next, using FIG. 19, process timings of decoding section 500 in FIG. 13 will be explained in a case of dividing a data symbol period into blocks as shown in FIG. 18 and applying interleaving only in a block.

Figure 19:
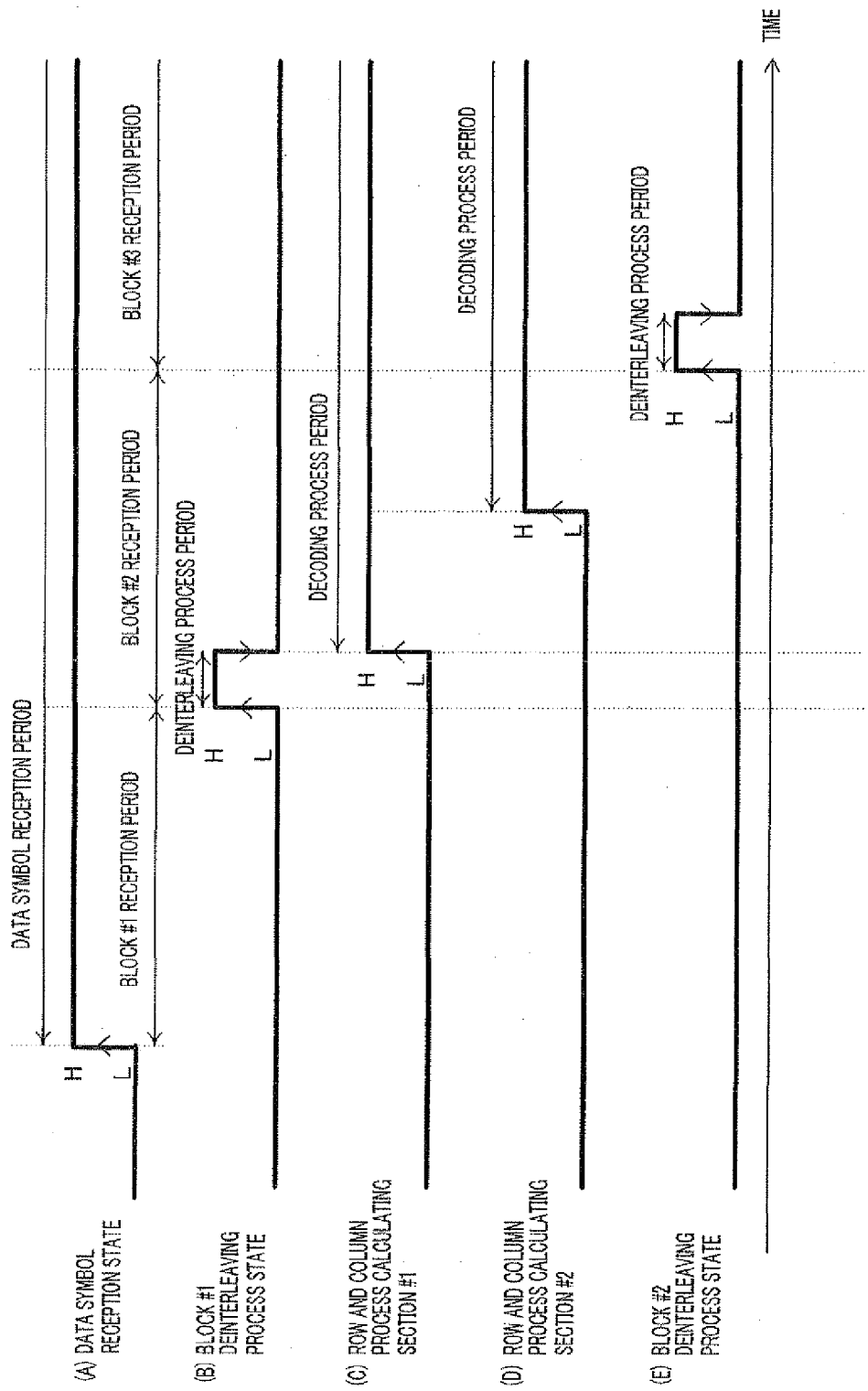
FIG. 19 is a timing chart showing a signal processing timing on the receiving side according to Embodiment 3.

FIG. 19($a$) shows a reception state of data symbol 802 in a receiving apparatus. Here, assume that the receiving apparatus is in a state of receiving data symbol 802 in the "H" period and in a state of not receiving data symbol 802 in the "L" period.

FIG. 19($b$) shows deinterleaving the data of block #1 (901 #1) after block #1 (901 #1) in FIG. 18 has been received. That is, in the "H" period, the data of block #1 (901 #1) is deinterleaved.

FIG. 19($c$) shows the operation timing of row and column calculating section #1 (507 #1) in FIG. 13. In the "H" period, row and column process calculating section #1 (507 #1) performs row and column process calculations. Here, immediately after the start of operations, process <1> in FIG. 6 or FIG. 7 is performed. FIG. 19($d$) shows the operation timing of row and column process calculating section #2 (507 #2) in FIG. 13.

As understood from FIG. 19($a$), FIG. 19($b$) and FIG. 19($c$), it is possible to deinterleave all of the data of block #1 (901 #1) by deinterleaver 213 (in FIG. 9) immediately after block #1 (901 #1) has been received, and perform row and column process calculations by row and column process calculating section #1 (507 #1) immediately after the deinterleaving process is finished.

Further, as shown in FIG. 9(d), row and column process calculating section #2 (507 #2) starts row and column process calculations after a certain time interval from the time row and column process calculating section #1 (507 #1) starts row and column process calculations (corresponding to the time interval from the start of process of group G1 in row and column process calculating section #1 until the start of process of group G1 in row and column process calculating section #2). Row and column process calculating sections #2 to #Z sequentially start row and column calculations at certain time intervals.

FIG. 19(e) shows deinterleaving the data of block #2 (901 #2) after block #2 (901 #2) in FIG. 18 has been received. That is, in the "H" period, the data of block #2 (901 #2) is deinterleaved.

As understood from FIG. 19(a) and FIG. 19(e), it is possible to deinterleave all of the data of block #2 (901 #2) in deinterleaver 213 (in FIG. 9) immediately after block #2 (901 #2) has been received.

Also, naturally, before the data of block #2 (901 #2) has been deinterleaved, data for which row and column process calculating section #k (k=1, 2, ..., Z) can perform row and column processes, is limited to the data of block #1 (901 #1).

As described above, according to the present embodiment, in a transmitting apparatus that performs LDPC-CC coding, by dividing a data symbol period in one frame into two or more blocks, forming data of one block with "(degree+1)×N (natural number)×M (natural number)" bits and applying interleaving in the block, it is possible to shorten the calculation delay due to decoding process on the receiving side. This is effective especially when the receiving side performs BP decoding explained in Embodiments 1 and 2.

Although the present embodiment has been described using an LDPC-CC as an example, for example, it is equally possible to implement the present invention even in the case of preparing check matrix H with respect to, for example, a convolutional code disclosed in Non-Patent Document 8 and performing BP decoding.

Also, although a case has been described above with the present embodiment where the transmitting method and transmitting apparatus of the present invention are applicable to a system that performs LDPC-CC coding and LDPC-CC BP decoding, the transmitting method and transmitting apparatus of the present invention are not limited to these, and are equally applicable to, for example, a convolutional code disclosed in Non-Patent Document 8. That is, the transmitting method and transmitting apparatus of the present embodiment are applicable to even the case of preparing check matrix H with respect to a convolutional code disclosed in Non-Patent Document 8 and performing BP decoding. Even in this case, it is possible to provide the same effect as in the above embodiments.

Also, although an example has been described above with the present embodiment where BPSK is performed, the present invention is not limited to this, and it is equally possible to implement the present invention even in the case of using other modulation schemes such as QPSK, 16 QAM and 64 QAM.

Other Embodiments

Here, an implementation method for LDPC-CC codes will be explained using a check matrix different from the LDPC-CC check matrix explained above. Here, especially, as disclosed in Non-Patent Document 2, an implementation method for LDPC-CC codes will be explained in detail, using a check matrix where "1's" are present in protographs and specific positions.

Figure 20:
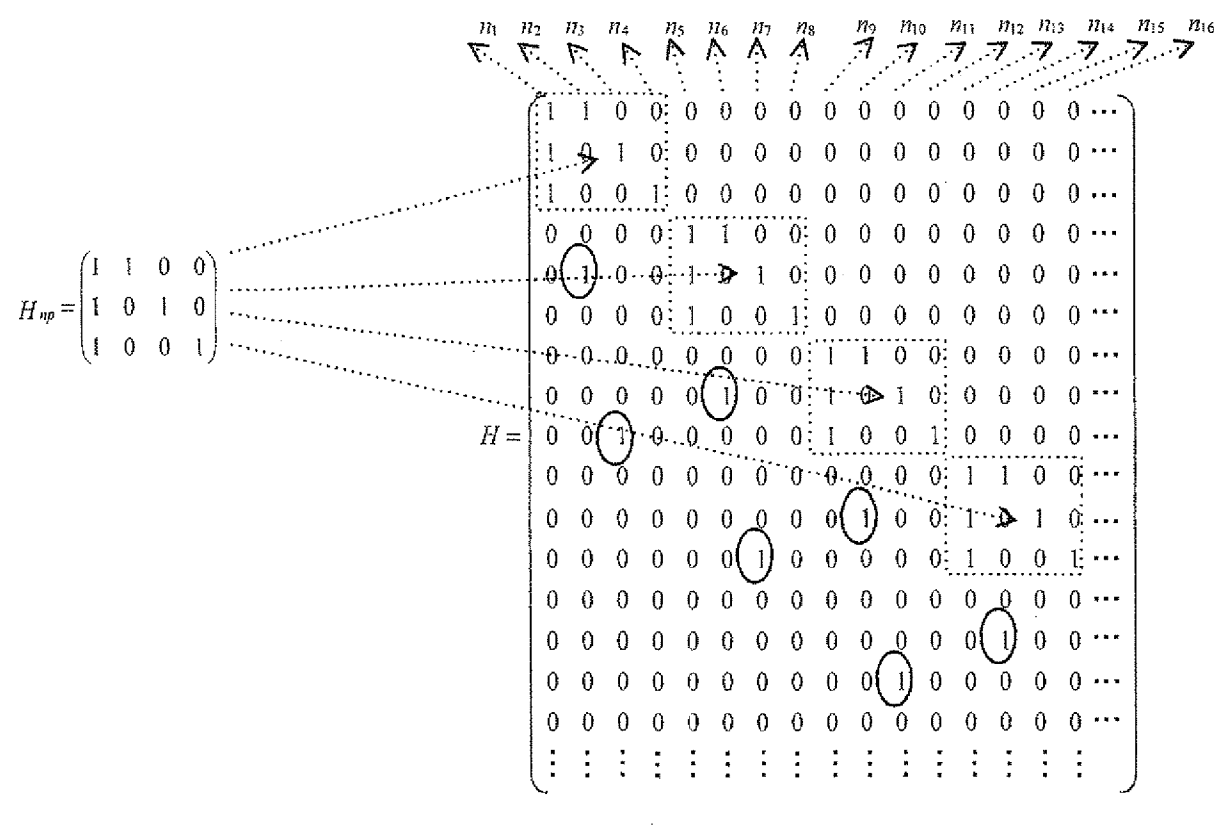

FIG. 20 shows an example of LDPC-CC check matrix H. Matrixes Hnp surrounded by dotted lines in FIG. 20 are referred to as "protographs." Check matrix H is formed on the basis of protograph Hnp. That is, protograph Hnp is a transposed parity check matrix for forming an LDPC-CC. Also, in check matrix H, in addition to protograph Hnp, "1's" (circled in FIG. 20) are allocated according to specific rules. Also, as shown in FIG. 20, a transmission sequence (i.e. encoded data) is represented by "nk" (natural number).

Figure 21:
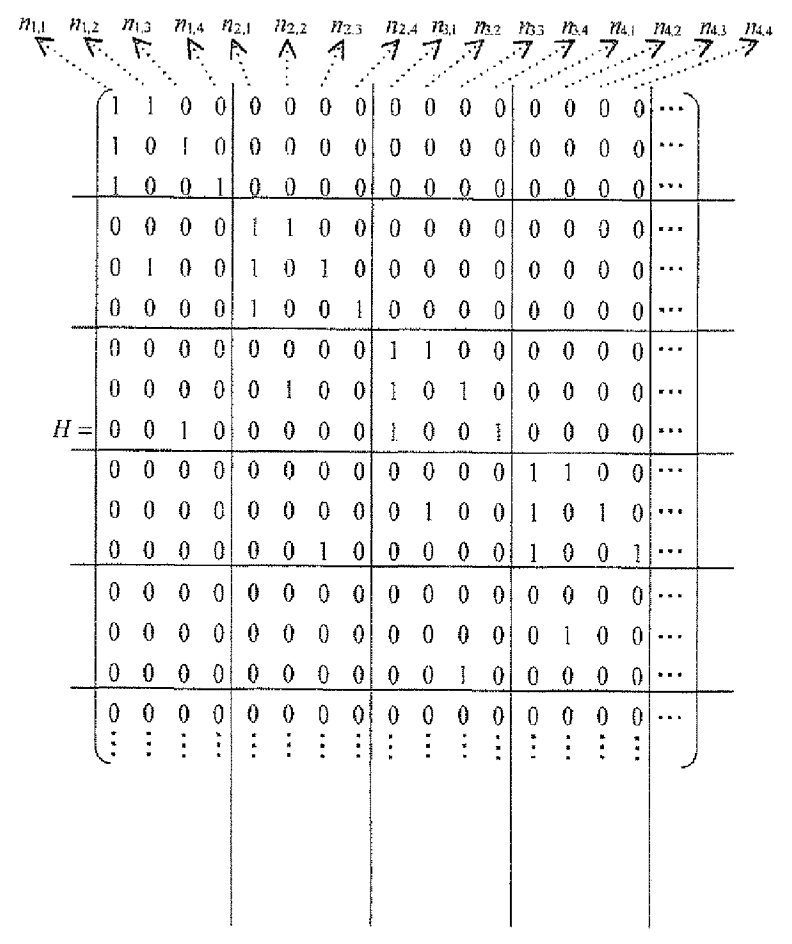

In the present embodiment, as shown in FIG. 21, check matrix H is divided. The rules of division are as follows.

1) The number of columns of protograph Hnp is four, and therefore the columns of check matrix are separated per four. Also, in FIG. 21, although the check matrix is separated per "the number of columns of the protograph" as an example, an essential requirement is to separate a check matrix per "(the number of columns of the protograph)×N (natural number)."

2) The number of rows of protograph Hnp is three, and therefore the rows of check matrix H are separated per three. Also, in FIG. 21, although the check matrix is separated per "the number of rows of the protograph," an essential requirement is to separate the check matrix per "(the number of rows of the protograph)×M (natural number)."

Check matrix H is separated according to the above rules 1 and 2. Further, by using the protographs formed by the above separation as a process unit of row process calculation and column process calculation, and by performing BP decoding in the process steps shown in FIG. 6 or FIG. 7, it is possible to provide the same effect as explained in Embodiments 1 and 2. That is, as shown in FIG. 20, even in an LDPC-CC using a check matrix where "1's" are present in protographs and specific positions, by dividing check matrix H as shown in the above rules 1 and 2, it is possible to implement BP decoding explained in Embodiments 1 and 2 and provide the same effect.

Also, in the ease of using an LDPC-CC of a check matrix where "1's" are present in protograph Hnp and specific positions as shown in FIG. 20, to shorten the calculation delay due to decoding process on the receiving side like Embodiment 3, the following interleaving process needs to be performed on the transmitting side. That is, it is necessary to divide a data symbol period in one frame into two or more blocks, form data of one block with "the number of columns of protograph Hnp forming check matrix H×N (natural number)" bits, and apply interleaving in the block.

The present invention is not limited to the above embodiments, and can be implemented with various changes. For example, although cases have been described above with embodiments where the present invention is realized mainly with hardware, it is equally possible to realize the present invention with software. For example, it is possible to store in advance the program that performs the methods of the present invention in a ROM (Read Only Memory) and operate the program by a CPU (Central Processor Unit).

Also, although example cases have been described above with embodiments where the present invention is applied to a transmitting apparatus and receiving apparatus (in FIG. 8 and FIG. 9) that perform single carrier transmission, the present invention is not limited to this, and is equally applicable to a transmission scheme using both a multicarrier transmission scheme like OFDM and a spectrum spread communication scheme.

The disclosure of Japanese Patent Application No. 2007-226822, filed on Aug. 31, 2007, including the specification, drawings and abstract, is incorporated herein by reference in its entirety.

INDUSTRIAL APPLICABILITY

The present invention is widely applicable to radio systems using an LDPC-CC and convolutional code.

The invention claimed is:

1. A decoding method that performs belief propagation decoding of a low density parity check convolutional code defined by a parity check matrix, comprising:
a calculating step of performing calculation using a plurality of calculation sequences in which a row process calculation and a column process calculation are combined, wherein
the row process calculation updates log-likelihood ratios corresponding to each row of a parity check matrix, and
the column process calculation updates log-likelihood ratios corresponding to each column of the parity check matrix; and
an estimating step of estimating a codeword using a calculation result in the calculating step, wherein:
the parity check matrix allocates regularly a protograph comprising a plurality of rows and a plurality of columns;
elements of the parity check matrix except for a position where the protograph is allocated are zero;
the calculating step sequentially calculates a plurality of groups in parallel at different times by a process period using the plurality of calculation sequences in which the row process calculation and the column process calculation are combined, and sequentially calculates different groups in each process period, wherein
rows of the parity check matrix are divided by a number of rows of the protograph constituting the parity check matrix multiplied by N, N being a natural number,
columns of the parity check matrix are divided by a number of columns of the protograph multiplied by M, M being a natural number, and
a plurality of blocks made of the divided rows and columns are allocated to the plurality of groups; and
sequential calculation is paused for at least one of the plurality of calculation sequences during a predetermined process period.

2. The decoding method of claim 1, wherein after finishing sequential calculation in each of the process period and after a pause period, the calculating step begins subsequent sequential calculation.

3. The decoding method of claim 1, wherein
at a first process time:
a first calculation sequence among the plurality of calculation sequences sequentially calculates a first group among the plurality of groups, and
a second calculation sequence among the plurality of calculation sequences pauses sequential calculation, and
at a second process time:
the first calculation sequence sequentially calculates a second group among the plurality of groups, and
the second calculation sequence sequentially calculates the first group.

4. A decoding apparatus that performs belief propagation decoding of a low density parity check convolutional code defined by a parity check matrix, comprising:
a plurality of calculation sequences in which a plurality of row process calculators and a plurality of column process calculators are combined, wherein
the plurality of row process calculators update log-likelihood ratios corresponding to each row of a parity check matrix, and
the plurality of column process calculators update log-likelihood ratios corresponding to each column of the parity check matrix; and
an estimator that estimates a codeword using a calculation result in the plurality of calculation sequences, wherein:
the parity check matrix allocates regularly a protograph comprising a plurality of rows and a plurality of columns;
elements of the parity check matrix except for a position where the protograph is allocated are zero;
the plurality of calculation sequences sequentially calculate a plurality of groups in parallel at different times by a process period, and sequentially calculates different groups in each process period, wherein
rows of the parity check matrix are divided by a number of rows of the protograph constituting the parity check matrix multiplied by N, N being a natural number,
columns of the parity check matrix are divided by a number of columns of the protograph multiplied by M, M being a natural number, and
a plurality of blocks made of the divided rows and columns are allocated to the plurality of groups; and
at least one of the plurality of row process calculators and at least one of the plurality of column process calculators pause sequential calculation during a predetermined process period.

5. The decoding apparatus of claim 4, wherein after finishing sequential calculation in each of the process period and after a pause period, the plurality of row process calculators and the plurality of column process calculators begin subsequent sequential calculation.

6. The decoding apparatus of claim 4, wherein the plurality of row process calculators and the plurality of column process calculators include a first row process calculator, a first column process calculator, a second row process calculator, and a second column process calculator, and
in a first process period:
the first column process calculator and the first row process calculator sequentially calculate a first group among the plurality of groups, and
the second column process calculator and the second row process calculator pause sequential calculation, and
in a second process period:
the first column process calculator and the first row process calculator sequentially calculate a second group among the plurality of groups, and
the second column process calculator and the second row process calculator sequentially calculate the first group.

* * * * *